United States Patent
Davis

(10) Patent No.: US 8,853,061 B1
(45) Date of Patent: *Oct. 7, 2014

(54) METHODS FOR MANUFACTURING NONPLANAR GRAPHITE-BASED DEVICES HAVING MULTIPLE BANDGAPS

(71) Applicant: Solan, LLC, Salt Lake City, UT (US)

(72) Inventor: Mark Alan Davis, Springville, UT (US)

(73) Assignee: Solan, LLC, Salt Lake City, UT (US)

(*) Notice: Subject to any disclaimer, the term of this patent is extended or adjusted under 35 U.S.C. 154(b) by 0 days.

This patent is subject to a terminal disclaimer.

(21) Appl. No.: 13/950,175

(22) Filed: Jul. 24, 2013

Related U.S. Application Data

(60) Provisional application No. 61/790,440, filed on Mar. 15, 2013.

(51) Int. Cl.
*H01L 29/66* (2006.01)
*H01L 29/06* (2006.01)
*H01L 21/02* (2006.01)
*B82Y 40/00* (2011.01)

(52) U.S. Cl.
CPC ........... *H01L 21/02527* (2013.01); *B82Y 40/00* (2013.01); *Y10S 977/842* (2013.01); *Y10S 977/734* (2013.01)
USPC 438/478; 257/26; 257/E29.168; 257/E51.038; 257/E51.04; 977/734; 977/842

(58) Field of Classification Search
CPC .............. H01L 29/66015; H01L 2924/13088; H01L 21/0237; H01L 21/02527; H01L 21/02592; H01L 21/02639; H01L 29/6625; H01L 29/7317; H01L 29/735; H01L 29/7781; H01L 29/1606; H01L 29/06
USPC ............. 438/478; 257/26, E29.168, E51.038, 257/E51.04; 977/734
See application file for complete search history.

(56) References Cited

U.S. PATENT DOCUMENTS 6,316,715 B1 11/2001 King et al.
6,660,928 B1 12/2003 Patton et al.
(Continued)

FOREIGN PATENT DOCUMENTS

EP  1 429 378 B1  2/2012
KR  10-2012-0063164 A  6/2012
(Continued)

OTHER PUBLICATIONS

Avouris et al., "Carbon-based electronics," *nature nanotechnology*, vol. 2, Oct. 2007, pp. 605-615.
(Continued)

*Primary Examiner* — Jarrett Stark
*Assistant Examiner* — Bitew Dinke
(74) *Attorney, Agent, or Firm* — Morgan, Lewis & Bockius LLP

(57) ABSTRACT

A method for forming a graphite-based device on a substrate having a plurality of zones is provided where the substrate is carbon doped in zones. Each such zone comprises a plurality of dopant profiles. One or more graphene stacks are generated in the doped zones. A graphene stack so generated comprises a non-planar graphene layer characterized by a bending angle, curvature, characteristic dimension, graphene orientation, graphene type, or combinations thereof. A method for forming a graphite-based device on a substrate is provided, the substrate comprising a graphene foundation material and a plurality of zones. The substrate is patterned to form features in the zones. One feature comprises a non-planar surface or at least two adjacent surfaces that are not coplanar. One or more graphene stacks are concurrently generated, at least one of which comprises a non-planar graphene layer overlaying the non-planar surface or the at least two adjacent surfaces.

22 Claims, 17 Drawing Sheets

(56) References Cited

U.S. PATENT DOCUMENTS

Figure 1A:
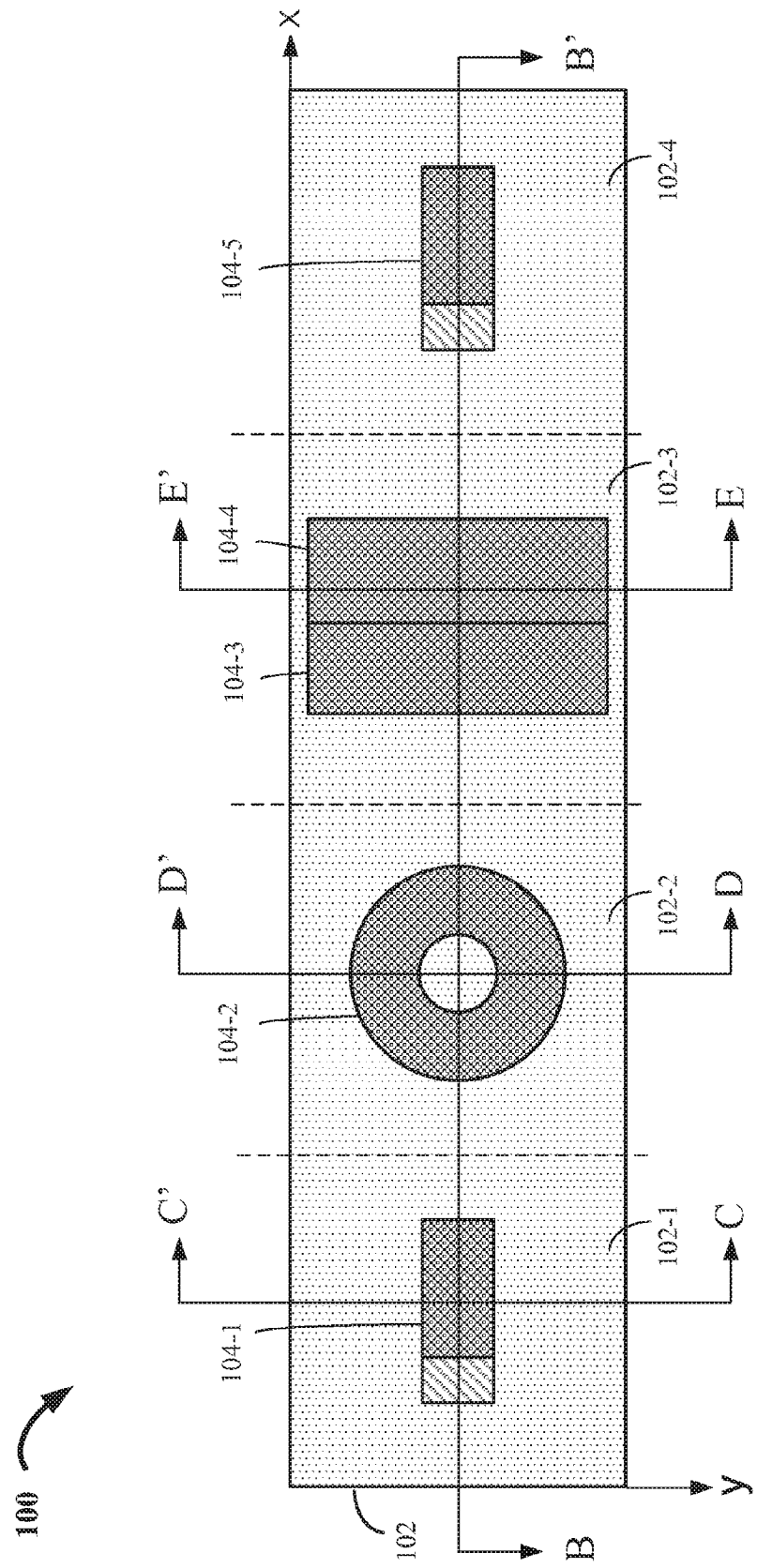

| | | | |
|---|---|---|---|
| 8,076,204 B2 | 12/2011 | Anderson et al. | |
| 8,168,964 B2* | 5/2012 | Hiura et al. | 257/9 |
| 8,268,180 B2 | 9/2012 | Arnold et al. | |
| 8,507,797 B2 | 8/2013 | Veerasamy | |
| 8,580,658 B1* | 11/2013 | Davis | 438/478 |
| 8,617,669 B1* | 12/2013 | Quick et al. | 427/586 |
| 8,664,642 B1* | 3/2014 | Davis | 257/29 |
| 2003/0098640 A1* | 5/2003 | Kishi et al. | 313/309 |
| 2004/0253820 A1* | 12/2004 | DeHeer et al. | 438/689 |
| 2009/0267189 A1* | 10/2009 | Carothers et al. | 257/613 |
| 2010/0200840 A1* | 8/2010 | Anderson et al. | 257/29 |
| 2010/0264032 A1* | 10/2010 | Bazant | 204/518 |
| 2010/0323113 A1* | 12/2010 | Ramappa et al. | 427/398.1 |
| 2011/0108805 A1* | 5/2011 | Okai | 257/26 |
| 2011/0171427 A1* | 7/2011 | Kim et al. | 428/152 |
| 2012/0003438 A1* | 1/2012 | Appleton et al. | 428/195.1 |
| 2012/0021249 A1 | 1/2012 | Shin et al. | |
| 2012/0068152 A1 | 3/2012 | Hwang et al. | |
| 2012/0085991 A1 | 4/2012 | Cohen et al. | |
| 2012/0141799 A1 | 6/2012 | Kub et al. | |
| 2012/0181507 A1 | 7/2012 | Dimitrakopoulos et al. | |
| 2012/0193603 A1 | 8/2012 | Chu et al. | |
| 2012/0205518 A1 | 8/2012 | Voutilainen et al. | |
| 2012/0205606 A1* | 8/2012 | Lee et al. | 257/2 |
| 2012/0225296 A1 | 9/2012 | Zhong et al. | |
| 2012/0228157 A1 | 9/2012 | Li et al. | |
| 2012/0241069 A1* | 9/2012 | Hofmann et al. | 156/60 |
| 2012/0248401 A1 | 10/2012 | Shin et al. | |
| 2012/0257854 A1 | 10/2012 | Donval et al. | |
| 2012/0267041 A1 | 10/2012 | Woo et al. | |
| 2012/0328956 A1* | 12/2012 | Oguni et al. | 429/232 |
| 2013/0015375 A1 | 1/2013 | Avouris et al. | |
| 2013/0045418 A1* | 2/2013 | Oguni et al. | 429/211 |
| 2013/0095305 A1* | 4/2013 | Choi et al. | 428/201 |
| 2013/0099195 A1* | 4/2013 | Seacrist et al. | 257/9 |
| 2013/0099329 A1* | 4/2013 | Gros-Jean et al. | 257/411 |
| 2013/0139865 A1* | 6/2013 | Lee et al. | 136/205 |
| 2013/0143374 A1* | 6/2013 | Hayashi et al. | 438/197 |
| 2013/0146846 A1 | 6/2013 | Adkisson et al. | |
| 2013/0266738 A1 | 10/2013 | Lin et al. | |
| 2013/0270188 A1 | 10/2013 | Karnik et al. | |
| 2014/0065426 A1 | 3/2014 | Ishihara et al. | |

FOREIGN PATENT DOCUMENTS

| | | | |
|---|---|---|---|
| WO | WO 2009/148679 A2 | 12/2009 | |
| WO | WO 2010-004681 A1 | 1/2010 | |
| WO | WO 2010/147860 A1 | 12/2010 | |
| WO | WO 2012/035551 A1 | 3/2012 | |
| WO | WO 2012/120264 A1 | 9/2012 | |
| WO | WO 2012/125898 A1 | 9/2012 | |

OTHER PUBLICATIONS

Bae et al., "Roll-to-roll production of 30-inch graphene films for transparent electrodes," *Nature Nanotechnology,* vol. 5, Aug. 2010, pp. 574-578.

Barone et al., (2006) "Electronic Structure and Stability of Semiconducting Graphene Nanoribbons" Nano Letters vol. 6, No. 12, pp. 2748-2754.

Behnam, et al., (2011) "Electronic Transport in Graphitic Nanoribbon Films," ACSNANO.org, vol. 5, No. 3 1617-1622.

Berger et al., "Electronic Confinement and Coherence in Patterned Epitaxial Graphene," *Science,* vol. 312, May 26, 2006, pp. 1191-1196.

Blankenburg et al., "Intraribbon Heterojunction Formation in Ultranarrow Graphene Nanoribbons," ACSNANO.org, vol. 6, No. 3, (2012) pp. 2020-2025.

Cai et al., "Atomically precise bottom-up fabrication of graphene nanoribbons," *Nature,* vol. 466, Jul. 22, 2010, pp. 470-473.

Chang et al., "Multilayered graphene efficiently formed by mechanical exfoliation for nonlinear saturable absorbers in fiber mode-locked lasers," *Applied Physics Letters,* 97, 211102 (2010) pp. 211102-1-211102-3.

Ci et al., "Controlled Nanocutting of Graphene," *Nano Res* (2008), 1: 116-122.

Coletti, et al., (2010) "Charge neutrality and band-gap tuning of epitaxial graphene on SiC by molecular doping" *Physical Review B* 81, 235401, 235401-1-235401-8.

Cotal, et al., (2009) "III-V multijunction solar cells for oncentrating photovoltaics," *Energy Environ. Sci.,* 2, 174-192.

Datta et al., "Crystallographic Etching of Few-Layer Graphene," *Nano Letters,* 2008, vol. 8, No. 7, pp. 1912-1915.

Elías, et al., (2010) "Longitudinal Cutting of Pure and Doped Carbon Nanotubes to Form Graphitic Nanoribbons Using Metal Clusters as Nanoscalpels," *Nano Letters* 10, 366-372.

Ezawa, Motohiko, (2007) "Peculiar Band Gap Structure of Graphene Nanoribbons," *Physica Status Solidi* (c) 4, No. 2, 489, (8 pages).

Finkenstadt, et al., (2007) "From graphene to graphite: A general tight-binding approach for nanoribbon carrier transport," *Physical Review B* 76, 121405(R), 121405-1-121405-4.

Fonash, Stephen J., "Schottky-Barrier-Type Optoelectronic Structures," *Metal-Semiconductor Schottky Barrier Junctions and Their Applications,* Ed. by B.L. Sharma, Plenum Press, 1984, pp. 161-189.

Fujii et al., "Cutting of Oxidized Graphene into Nanosized Pieces," *J. Am. Chem. Soc.* 2010, 132, pp. 1003-10041.

Gao et al., "Oxidation Unzipping of Stable Nanographenes into Joint Spin-Rich Fragments," *J. Am. Chem. Soc.* (2009), 131, 9663-9669.

Giovannetti, et al., (2008) "Doping Graphene with Meta Contacts," *PRL* 101, 026803-1-020803-4.

Guo, et al., (2011) "Graphene Doping: A Review," *Insciences J.,* 80-89; doi: 10.5640/insc.010280.

Guo, et al., (2011), "Graphene Based Materials; Enhancing Solar Energy Harvesting," *Adv. Energy Mater.* 1, 448-452.

Gupta et al., " Schottky Barrier Photodiodes," *Metal-Semiconductor Schottky Barrier Junctions and Their Applications,* Ed. by B.L. Sharma, Plenum Press, 1984, pp. 191-218.

Hakala, et al., (2008) "First-principles study of adsorption, diffusion, and charge stability of metal adatoms on alkali halide surfaces" *Physical Review B* 78, 045418-1-045418-8.

Han et al., "Energy Band-Gap Engineering of Graphene Nanoribbons," *Physical Review Letters (PRL)* 98, 206805 (2007) pp. 206805-1-206805-4.

Henry, C.H., (1980) "Limiting efficiencies of ideal single and multiple energy gap terrestrial solar cells," *J. Appl. Phys.* 51, pp. 4494-4500: doi; 10.1063/1.328272.

Jayasena et al., "A novel mechanical cleavage method for synthesizing few-layer graphenes," *Nanoscale Research Letters,* 2011, 6:95, pp. 1-7.

Jia, et al., (2009) "Controlled Formation of Sharp Zigzag and Armchair Edges in Graphitic Nanoribbons" *Science* 323, 1701-1705.

Jiao et al., "Narrow graphene nanoribbons from carbon nanotubes," *Nature,* vol. 458, Apr. 16, 2009, pp. 877-880.

Kato et al., "Site- and alignment-controlled growth of graphene nanoribbons from nickel nanobars," *Nature Nanotechnology,* vol. 7, Oct. 2012, pp. 651-656.

Kim et al., "Large-scale pattern growth of graphene films for stretchable transparent electrodes," *Nature,* vol. 457, Feb. 5, 2009, pp. 706-710.

King, et al., (2000), "Next-Generation, High-Efficiency III-V Multijunction Solar Cells," *28th IEEE Photovoltaic Specialists Conference,* Anchorage, Alaska, Sep. 15-22, 2000 (4 pages).

Kosynkin et al., "Longitudinal unzipping of carbon nanotubes to form graphene nanoribbons, "*Nature,* vol. 458, Apr. 16, 2009, (7 pages).

Li, at al., "Chemically Derived, Ultrasmooth Graphene Nanoribbon Semiconductors," *Science,* 319, 1229 (2008), pp. 1229-1232.

Li, at al., (2010) "Graphene-On-Silicon Schottky Junction Solar Cells" *Adv. Mater.* 22, 2743-2748.

Li, at al., "Large-Area Synthesis of High-Quality and Uniform Graphene Films on Copper Foils," *Science,* vol. 324, Jun. 5, 2009, pp. 1312-1314.

Lin, et al., (2008) "Electrical observation of subband formation in graphene nanoribbons," *Physical Review B* 78, 161409(R), 161409-1-161409-4.

Liu et al., "Band-gap scaling of graphene nanohole superlattices," *Physical Review B* 80, 233405 (2009), pp. 233405-1-233405-4.

(56) References Cited

OTHER PUBLICATIONS

Liu et al., "Stripe-kink microstructures formed in mechanical peeling of highly orientated pyrolytic graphite," *Applied Physics Letters*, 96, 201909 (2010), pp. 201909-1-201909-3.

Ma, et al., "Strain-Induced Orientation-Selective Cutting of Graphene into Graphene Nanoribbons on Oxidation," *Angew, Chem. Int, Ed*, 51, pp. 1161-1164 (2012).

McAllister et al., "Single Sheet Functionalized Graphene by Oxidation and Thermal Expansion of Graphite," *Chem. Mater*, 2007, 19, 4396-4404.

Patent Informatics Team, "An Analysis of Worldwide Patent Filings Relating to Graphene," *Intellectual Property Office, Concept House*, Cardiff Rd, Newport, South Wales, NP10 8QQ, UK, (2011), pp. 2-11.

Reina et al., "Large Area, Few-Layer Graphene Films on Arbitrary Substrates by Chemical Vapor Deposition," *Nano Letters*, 2009, vol. 9, No. 1, pp. 30-35.

Sinitskii et al., "Patterning graphene nanoribbons using copper oxide nanowires," *Applied Physics Letters*, 100, 103106 (2012), pp. 103106-1-103106-3.

Stauber, et al., (2008), "Optical conductivity of graphene in the visible region of the spectrum," *Physical Review B* 78, 085432, 085432-1-085432-8.

Sutter et al., "Epitaxial graphene on ruthenium," *Nature Materials*, vol. 7, May 2008, pp. 406-411.

Tapasztó et al., "Tailoring the atomic structure of graphene nanoribbons by scanning tunnelling microscope lithography," *Nature nanotechnology*, vol. 3, Jul. 2008, pp. 397-401.

Terrones, et al., (2010) "Graphene and graphite nanoribbons: Morphology, properties, synthesis, defects and applications," *Nano Today* 5, 351-372.

Tyagi, M.S., "Physics of Schottky Barrier Junctions," *Metal-Semiconductor Schottky Barrier Junctions and Their Applications*, Ed. By B.L. Sharma, Plenum Press, 1984, 1-60.

Wan, et al., (2011) "Graphene—A Promising Material for Organic Photovoltaic Cells," *Adv. Mater.* 23, 5342-5358.

Wu et al., "Efficient Synthesis of Graphene Nanoribbons Sonochemically Cut from Graphene Sheets," *Nano Res* (2010) 3: 16-22.

Xie et al., "Graphene Nanoribbons from Unzipped Carbon Nanotubes: Atomic Structures, Raman Spectroscopy, and Electrical Properties," *J. Am. Chem. Soc.* 2011, 133, pp. 10394-10397.

Yang et al., "Two-Dimensional Graphene Nanoribbons," *J. Am Chem. Soc.*, 2008, 130, 4216-4217.

Yastrebova, N., (Apr. 2007) "High-efficiency multi-junction solar cells: Current status and future potential" *Centre for Research in Photonics*, University of Ottawa (22 pages).

Zhang et al., "Fabrication and electric-field-dependent transport measurements of mesoscopic graphite devices," *Appl.Phys. Ltrs*, 86, 073104 (2005), 073104-1073104-3.

International Search Report for International Patent Application No. PCT/US2014/022128, mailed Jul. 11, 2014, 4 pages.

\* cited by examiner

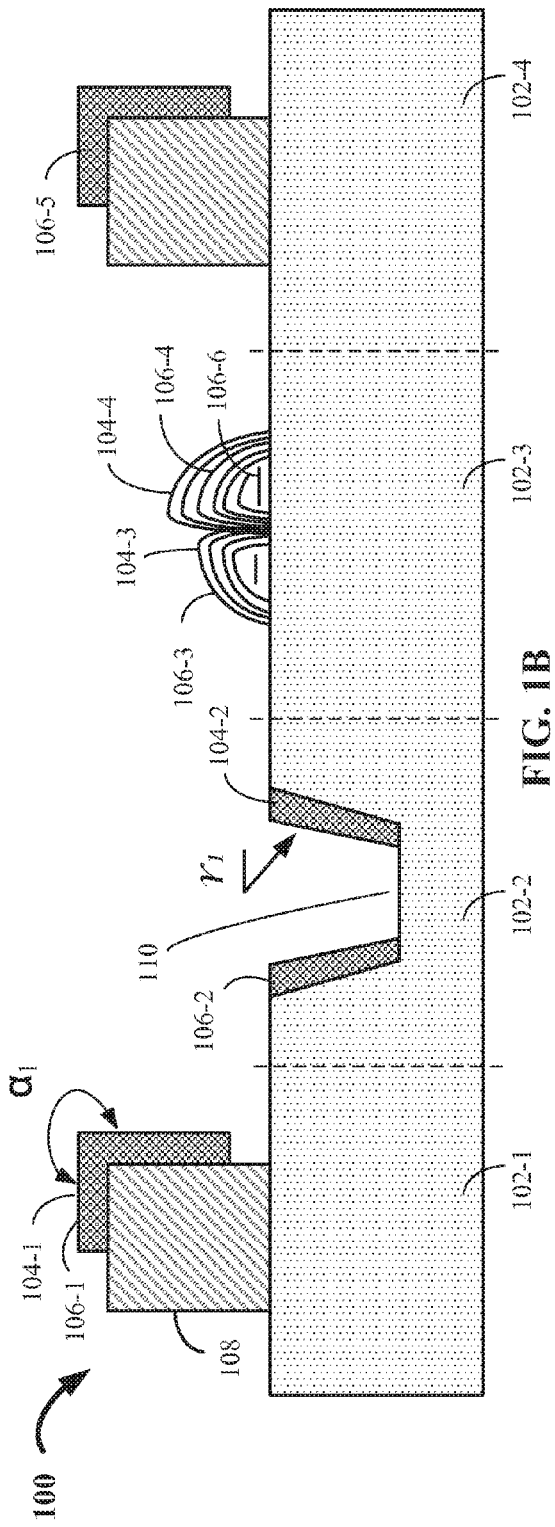
FIG. 1B
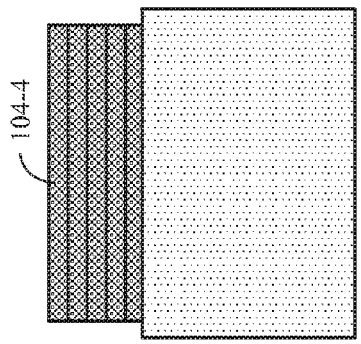
FIG. 1E
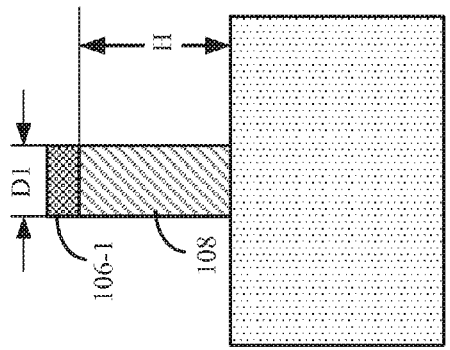
FIG. 1D
FIG. 1C

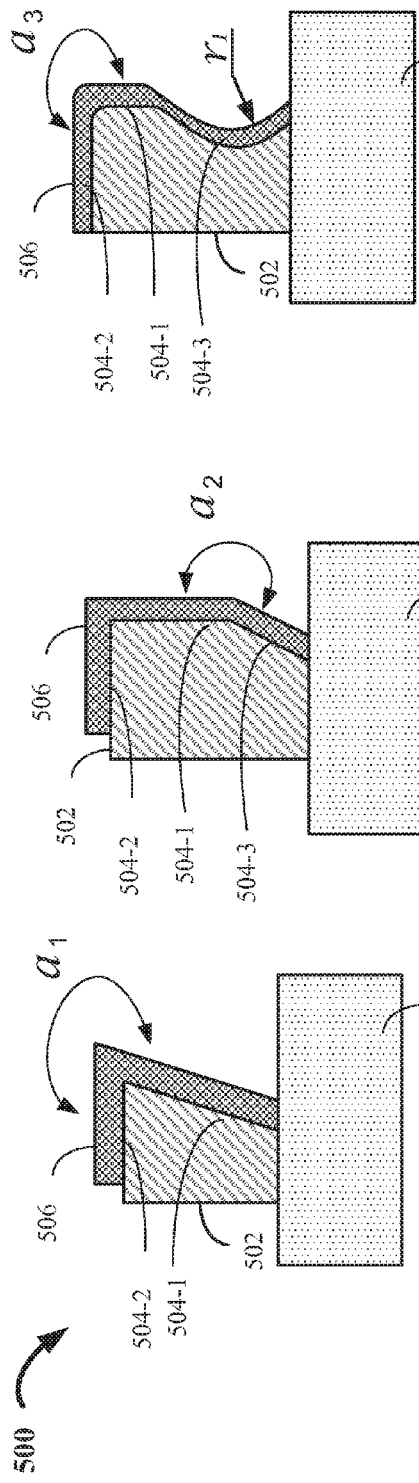

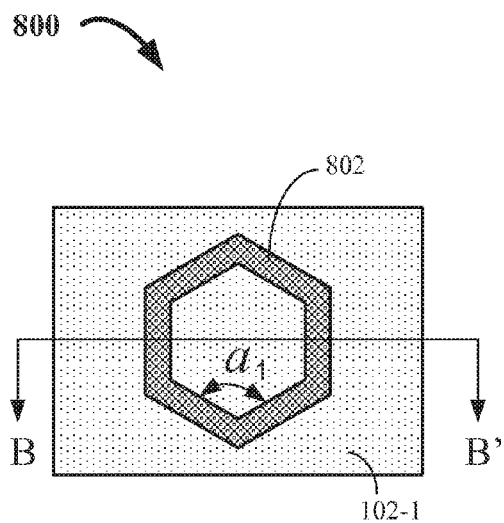
FIG. 8A
FIG. 8B
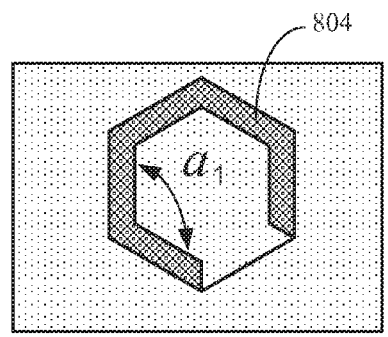
FIG. 8C
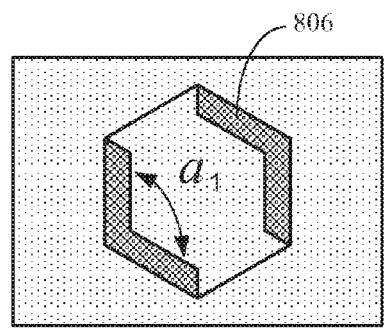
FIG. 8D
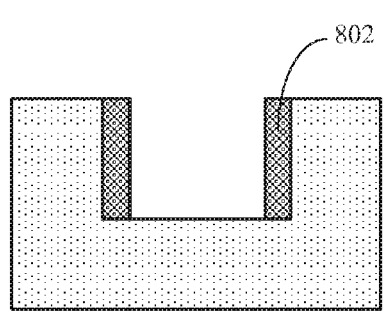
FIG. 8E
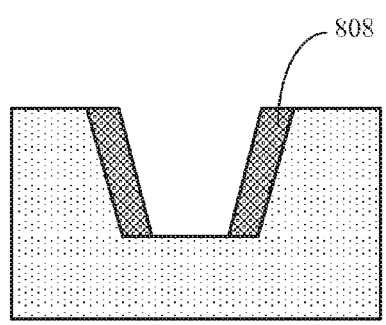
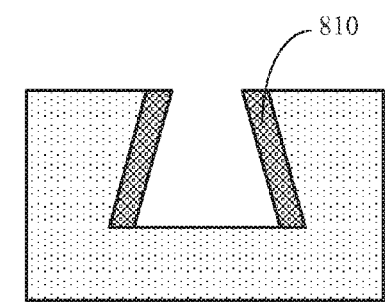
FIG. 8F

METHODS FOR MANUFACTURING NONPLANAR GRAPHITE-BASED DEVICES HAVING MULTIPLE BANDGAPS

CROSS REFERENCE TO RELATED APPLICATION

This application claims priority to U.S. Patent Application No. 61/790,440, filed Mar. 15, 2013, which is hereby incorporated by reference herein in its entirety.

1. FIELD OF THE DISCLOSURE

The present disclosure is generally related to non-planar graphite-based structures and devices and methods for fabricating such structures and devices.

2. BACKGROUND

Graphite-based structures or devices, e.g. graphene quantum dots, graphene nanoribbons (GNRs), graphene nanonetworks, graphene plasmonics and graphene superlattices, exhibit many exceptional chemical, mechanical, electronic and optical properties, and are very desirable for use in electronic devices, composite materials, and energy generation and storage. Such graphite-based structures in general comprise a graphene layer, typically nanometers thick and having a characteristic dimension also in the nanometers range. For example, in order to obtain adequate band gaps for operation at room temperature, GNRs typically have a width within a few nanometers due to the inverse relationship between the band gap and the width of the GNRs. The specific geometrical requirements impose challenges on the development of fabrication methods that can produce graphite-based structures with controllable and reliable topography to achieve desired functionalities.

Another challenge in the development of fabrication methods is related to packing density. The ability to pack structures and devices onto a surface with high packing density is an important issue. Because packing density or workable surface area determines functionalities of devices such as efficiency of solar cells or detectors, extensive work has been dedicated to isolation of graphene layers and attempted to reduce or eliminate workable surface area loss. However, current techniques use horizontal isolation, resulting in workable surface area loss and thus a dissatisfactory yield.

Current methods for fabricating such graphite-based structures are complicated, expensive, inefficient and highly inconsistent, and are mainly limited to laboratories. These methods can be broadly classified as epitaxial growth, chemical vapor deposition (CVD) growth, colloidal suspension, unconventional methods and exfoliation (See, e.g., Jayasen and Subbiah, 2011, Nanoscale Research Letter, 6:95; Parrish, "Graphene Growth Techniques for Use in Nanoelectronics").

Current fabrication methods generally involve patterning graphene, after graphene generation, into desired shapes and sizes. Patterning graphene, however, is very difficult because maintaining selectivity when etching carbon based materials is difficult in relation to other materials. It is in particular a notoriously difficult process in the nanoscale dimensions. As a result, current methods have several drawbacks. For example, the required etching for patterning graphene sheets into desired shapes often produce graphite-based structures with unpredictable geometries and erratic edge structures, yielding unsatisfactory functionalities of the graphite-based devices. Also, current methods generally use horizontal isolation, resulting in less usable surface area, lower packing density and accordingly lower efficiency of the graphite-based devices.

Given the above background, there is a need in the art for fabrication methods that can produce controllable, reliable and precise graphite-based structures without patterning the graphene layers, and in some cases, with multiple or enhanced functionalities.

3. SUMMARY

The present disclosure advantageously provides for a wide variety of graphene or graphite-based devices in various configurations. Generally, graphene or graphite-based devices of the present disclosure comprise a graphene stack with at least one non-planar graphene layer that is characterized by a bending angle, a curvature, a characteristic dimension, a graphene orientation, a graphene type, or any combination of these or other characteristics. Graphene or graphite-based devices of the present disclosure can be used in many applications. Examples include self-centering devices such as conic devices that can interact with photons in resonance or variable wavelength ranges, solar cells that can track solar photons, reflection or concentration devices that can redirect or concentrate photons to a target region, and antenna arrays that can absorb or emit photons in specific wavelength ranges.

One aspect provides a method for forming a graphite-based device on a substrate, where the substrate comprises a plurality of zones. The method comprises doping the substrate with carbon. The doping provides for one or more doped zones, where each doped zone in the one or more doped zones comprises a plurality of dopant profiles. There is concurrently generated one or more graphene stacks in the one or more doped zones. A first graphene stack in the one or more graphene stacks comprises a first non-planar graphene layer that is characterized by (i) a first bending angle, (ii) a first curvature, (iii) a first characteristic dimension, (iv) a first graphene orientation, (v) a first graphene type, or (vi) a combination thereof.

In some embodiments, a first zone in the plurality of zones is doped with a first plurality of dopant profiles, and the first graphene stack is generated in the first zone.

In some embodiments, a second zone in the plurality of zones is doped with a second plurality of dopant profiles, and a second graphene stack is generated in the second zone, where the second graphene stack differs from the first graphene stack generated in the first zone in at least one of (i) a bending angle, (ii) a curvature, (iii) a characteristic dimension, (iv) a graphene orientation, or (v) a graphene type.

In some embodiments, a second zone in the plurality of zones is doped with a second plurality of dopant profiles, and a second graphene stack is generated in the second zone, wherein the second graphene stack is substantially the same as the first graphene stack generated in the first zone.

In some embodiments, a second graphene stack is generated in the first zone, the second graphene stack differs from the first graphene stack in at least one of (i) a bending angle, (ii) a curvature, (iii) a characteristic dimension, (iv) a graphene orientation, or (v) a graphene type, and the second graphene stack is separated from the first graphene stack by a boundary condition.

Another aspect of the present disclosure provides a method for forming a graphite-based device on a substrate, wherein the substrate comprises a plurality of zones. The method comprises creating one or more non-planar graphene foundation layers in one or more selected zones in the plurality of zones and concurrently generating one or more graphene stacks by using the one or more non-planar graphene foundation layers in the one or more selected zones, wherein a first graphene stack in the one or more graphene stacks comprises a first non-planar graphene layer that is characterized by (i) a first bending angle, (ii) a first curvature, (iii) a first characteristic dimension, (iv) a first graphene orientation, (v) a first graphene type, or (vi) a combination thereof.

In some embodiments, the creating the one or more non-planar graphene foundation layers is conducted using oblique angle deposition.

In some embodiments, the creating the one or more non-planar graphene foundation layers comprises conformally depositing a graphene foundation layer in the one or more selected zones in the plurality of zones, and anisotropically etching the graphene foundation layer to form a non-planar graphene foundation layer.

Another aspect of the present disclosure provides a method for forming a graphite-based device on a substrate, wherein the substrate comprises a graphene foundation material and a plurality of zones. The method comprises patterning the substrate to form one or more features in one or more selected zones in the plurality of zones, wherein a first feature in the one or more features is formed in a first zone in the one or more selected zones, and the first feature comprises (i) a non-planar surface, or (ii) at least two adjacent surfaces that are not on a common plane, and concurrently generating one or more graphene stacks in one or more selected zones in the plurality of zones, where a first graphene stack in the one or more graphene stacks comprises a first non-planar graphene layer (i) overlaying the non-planar surface of the first feature formed in the first zone or (ii) overlaying the at least two adjacent surfaces that are not on a common plane of the first feature formed in the first zone.

In some embodiments, the first non-planar graphene layer is characterized by the first bending angle, and a second graphene stack in the one or more graphene stacks comprises a second non-planar graphene layer that is characterized by a second bending angle, where the first bending angle and the second bending angle are different.

In some embodiments, the first non-planar graphene layer is characterized by the first curvature, and a second graphene stack in the one or more graphene stacks comprises a second non-planar graphene layer that is characterized by a second curvature, where the first curvature and the second curvature are different.

In some embodiments, the first non-planar graphene layer is characterized by the first characteristic dimension, and a second graphene stack in the one or more graphene stacks comprises a second non-planar graphene layer that is characterized by a second characteristic dimension, where the first characteristic dimension and the second characteristic dimension are different.

In some embodiments, the first non-planar graphene layer is characterized by the first graphene orientation, and a second graphene stack in the one or more graphene stacks comprises a second non-planar graphene layer that is characterized by a second graphene orientation, where the first graphene orientation and the second graphene orientation are different.

In some embodiments, the first non-planar graphene layer is characterized by a first graphene type, and a second graphene stack in the one or more graphene stacks comprises a second non-planar graphene layer that is characterized by a second graphene type, where the first graphene type and the second graphene type are different.

In some embodiments, the first non-planar graphene layer consists of 1 graphene sheet. In some embodiments, the first non-planar graphene layer consists of between 2 and 100 graphene sheets. In some embodiments, the first non-planar graphene layer consists of over 100 graphene sheets.

4. BRIEF DESCRIPTION OF THE DRAWINGS

The accompanying drawings, which are incorporated into and constitute a part of this specification, illustrate one or more embodiments of the present application and, together with the detailed description, serve to explain the principles and implementations of the application.

FIGS. 1A-1E provide graphical representations of exemplary graphite-based devices with a non-planar graphene layer, in accordance with some embodiments of the present disclosure.

FIGS. 2A-2F provide graphical representations of exemplary graphite-based devices with a curved graphene layer, in accordance with some embodiments of the present disclosure.

FIGS. 3A-3F provide graphical representations of exemplary graphite-based devices with a curved graphene layer in variable configurations, in accordance with some embodiments of the present disclosure.

FIGS. 4A-4D provide graphical representations of other exemplary graphite-based devices with a curved graphene layer, in accordance with some embodiments of the present disclosure.

FIGS. 5A-5E provide graphical representations of exemplary graphite-based devices with a bent graphene layer in variable configurations, in accordance with some embodiments of the present disclosure.

FIGS. 6A-6D provide graphical representations of other exemplary graphite-based devices with a bent graphene layer in variable configurations, in accordance with some embodiments of the present disclosure.

FIGS. 7A-7F provide graphical representations of other exemplary graphite-based devices with a bent graphene layer in variable configurations, in accordance with some embodiments of the present disclosure.

FIGS. 8A-8F provide graphical representations of other exemplary graphite-based devices with a bent graphene layer in variable configurations, in accordance with some embodiments of the present disclosure.

Figure 9A:
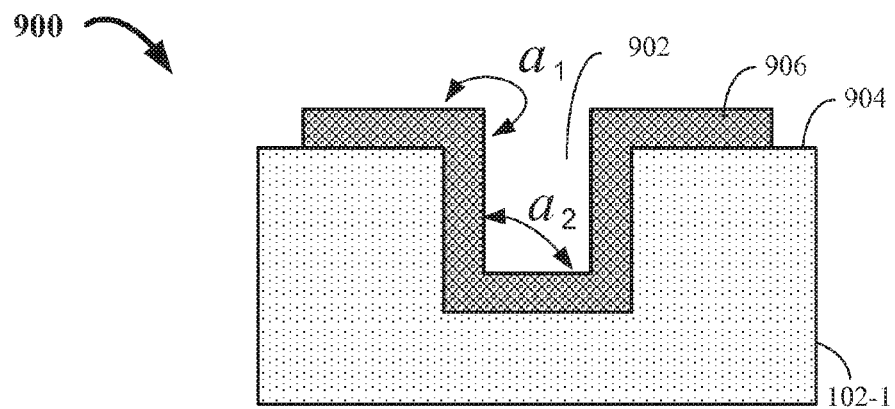
Figure 9B:
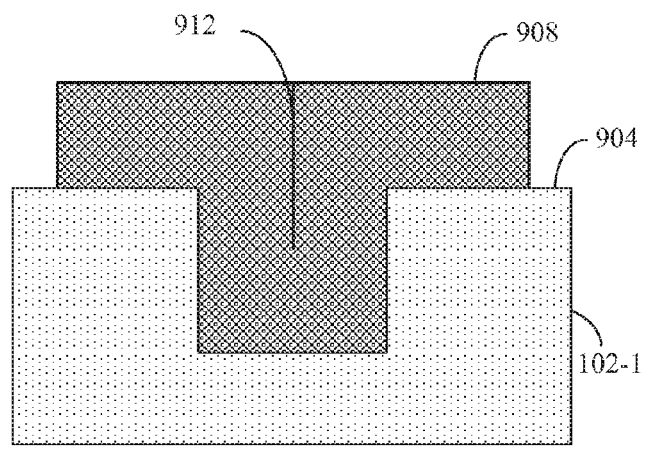
Figure 9C:
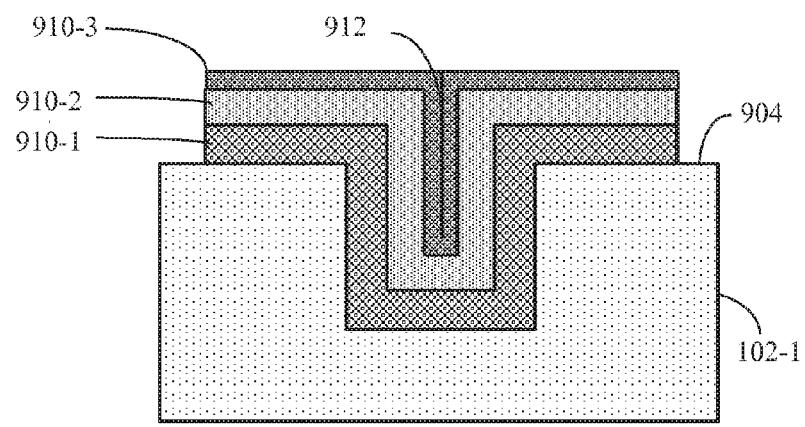

FIGS. 9A-9C provide graphical representations of other exemplary graphite-based devices with a bent graphene layer in variable configurations, in accordance with some embodiments of the present disclosure.

Figure 10A:
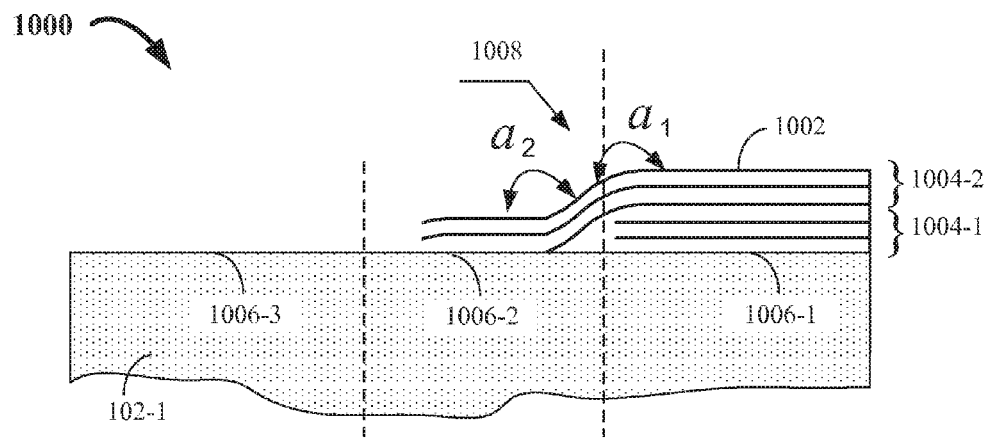
Figure 10B:
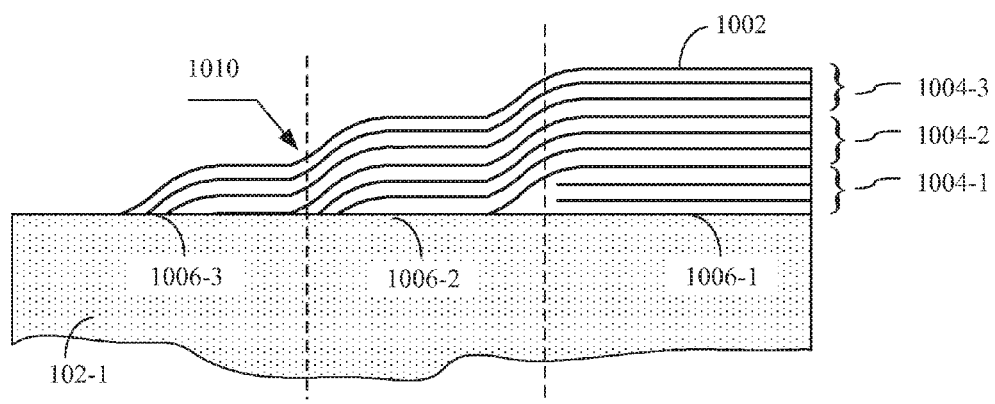
Figure 10C:
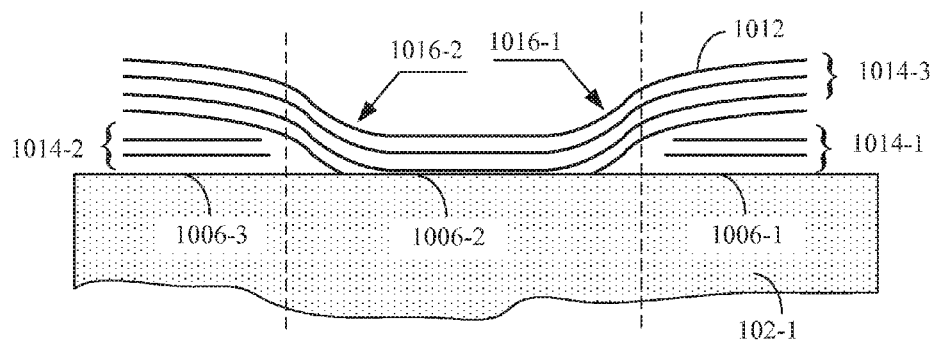

FIGS. 10A-10C provide graphical representations of exemplary graphite-based devices with a graphene stack having a graphene profile in variable configurations, in accordance with some embodiments of the present disclosure.

FIGS. 11A-11D provide graphical representations of exemplary graphite-based devices in variable configurations, in accordance with some embodiments of the present disclosure.

Figure 12:
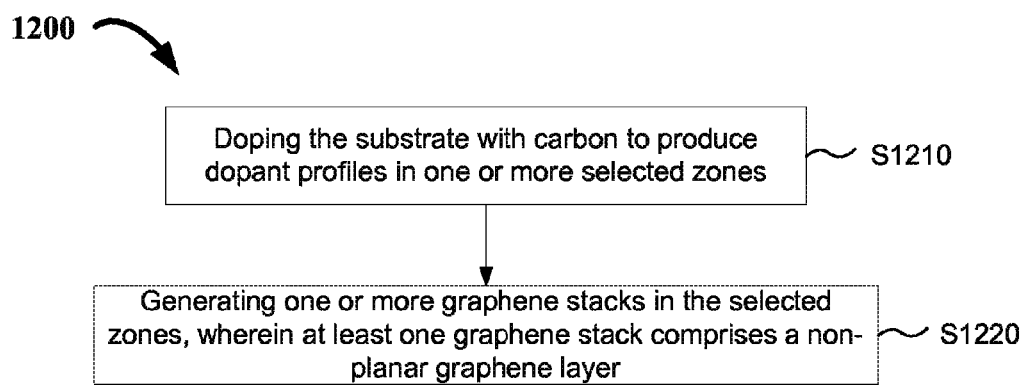

FIG. 12 provides a flow chart of an exemplary method for fabricating graphite-based devices, in accordance with some embodiments of the present disclosure.

Figure 13:
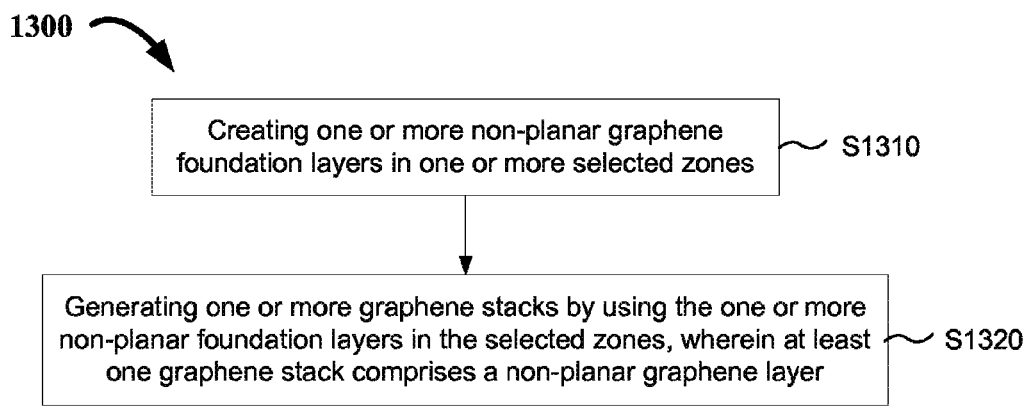

FIG. 13 provides a flow chart of another exemplary method for fabricating graphite-based devices, in accordance with some embodiments of the present disclosure.

Figure 14:
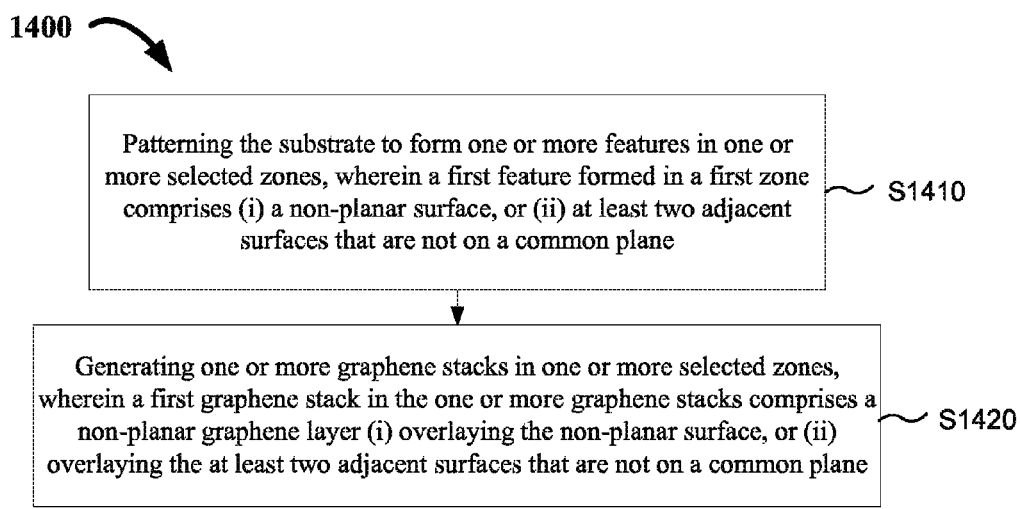

FIG. 14 provides a flow chart of another exemplary method for fabricating graphite-based devices, in accordance with some embodiments of the present disclosure.

Like reference numerals refer to corresponding parts throughout the drawings.

5. DETAILED DESCRIPTION

Embodiments of the present disclosure are described in the context of graphite-based devices and methods for fabricating such graphite-based devices. The present disclosure provides for exemplary graphite-based devices in various configurations, each of which comprises any number of graphene layers with at least one non-planar graphene layer. In many embodiments, a graphene layer is characterized by a bending angle, a curvature, a characteristic dimension, a graphene orientation, a graphene type, or any combination of these or other characteristics. In some embodiments, a non-planar graphene layer overlays a non-planar surface on a substrate, or a plurality of surfaces that do not reside on a common plane. In some embodiments, each layer in a plurality of graphene layers is stacked together and collectively form a graphene profile with different characteristic dimensions. In some embodiments, the outermost graphene layer covers or encapsulates the inner graphene layers. The inner graphene layers can be either planar or non-planar. In some embodiments, a graphene layer has a portion overhanging, abutting or joining another adjacent graphene layer, and is separated from the adjacent graphene layer by boundary conditions at an abutting or joining intersection.

This wide variety of configurations advantageously provides for the ability to generate a wide array of devices. For example, in many applications, it is desirable to have devices with large or extra workable surface areas to improve efficiency or other functionalities of the devices. Also, in many applications, it is desirable to have devices in which one graphene layer performs one function while another graphene layer performs another function. This is because the ability to provide multiple functions in the same device allows for more versatile and efficient devices (such as solar devices), integration of broadband devices (EUV through IR), increased efficiency by the design of elements to capture maximum peak wavelength energy, generation of neighboring effects of different functionality of graphene (single and multiple layers), reduced resistivity by use of more sheets, band gap tune ability, work function definition, denser packing of device, shorter mean free paths, better capture of photons, cascade devices (sometimes called stair case devices) where photons or wavelengths are stripped from top to bottom, advantageous optical properties and electrical interactions (e.g., sensing and response to specific wavelength at each level).

Other examples of applications include self-centering devices such as conic devices that can interact with photons in resonance or variable wavelength ranges, solar cells that can track solar photons, reflection or concentration devices that can redirect or concentrate photons to a target region, and antenna arrays that can absorb or emit photons in specific wavelength ranges.

In some embodiments, various methods are provided for fabricating graphite-based devices while achieving desired size, specified geometries, and characterized electronic/photonic properties of the graphite-based devices. An exemplary method includes doping a substrate (either patterned or non-patterned) with carbon to produce a plurality of dopant profiles in a selected zone or zones and then generating a non-planar graphene layer in the selected zone or zones. Another exemplary method includes creating a non-planar graphene foundation layer in a selected zone or zones and then generating a non-planar graphene layer in the selected zone or zones. In some embodiments, a non-planar graphene foundation layer can be created by oblique angle deposition, or by conformal deposition along with anisotropic etching. Another exemplary method includes patterning the substrate to form a feature with a non-planar surface or adjacent surfaces that are not in a common plane and then generating a non-planar graphene layer on a non-planar surface or on the adjacent surfaces that are not in a common plane. This diversity gives rise to the ability to design a wide variety of graphite-based devices as disclosed herein. Moreover, this is all accomplished without any requirement to post process graphene once the graphene has been formed.

Those of ordinary skill in the art will realize that the following detailed description of the present application is illustrative only and is not intended to be in any way limiting. Other embodiments of the present application will readily suggest themselves to such skilled persons having benefit of this disclosure. Reference will now be made in detail to implementations of the present application as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

5.1. Definitions

It will be understood that, although the terms "first," "second," etc. are optionally used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

As used herein, the term "sheet" refers to a substantially two-dimensional or one-atom thick substance. For example, a "graphene sheet" refers to one-atom-thick substance with carbon atoms arranged in a hexagonal lattice (e.g., a single sheet composed of $sp^2$-hybridized carbon). A "graphene sheet" also refers to a carbon-based sheet which comprises additional materials such as boron, oxides, dopants and/or edge atomic substitutes.

As used herein, the term "graphene layer" or "graphite layer" refers to a graphene sheet, or refers to several, several tens, several hundreds or several thousands of graphene sheets. The thickness of a graphene layer can therefore range a nanometer to several micrometers, or to several tens of micrometers depending upon the number of graphene sheets in the graphene layer. Final graphene layers produced by the processes disclosed in this application can have a thickness in nanometers, and preferably less than fifty nanometers. The terms "graphene layer" and "graphite layer" are interchangeable in the present disclosure.

As used herein, the term "graphite-based structure," "graphene structure," "graphene device," "graphene device topography" refers to a structure having at least one graphene layer on at least one surface of the structures. Examples of such structures or devices include, but are not limited to, graphene nanoribbons, graphene nanonetworks, graphene poles/pillars, and graphene based nanohole superlattices. The terms "graphite-based structure," "graphene structure," "graphene device," "graphene device topography" are interchangeable in the present disclosure.

As used herein, the term "element" refers to a feature configured or generated on a substrate. In general, at least a portion of the element is on or above the substrate. The element can be of any shape, size, or orientation. Exemplary elements include ribs, ribbons, pillars, mesas, geometries that produce or promote plasmonic effects, or other configurations. "Rib" or "ribbon" herein refers to a feature having a width smaller than a length. In some embodiments, "rib" and "ribbon" are interchangeable. "Pillar" herein refers to substantially circular, ovoid, regular or irregular features. "Mesa" herein refers to an island isolated from other features on the substrate or a plateau on the substrate. In general, a mesa has at least one dimension that is relatively large and thus can be used as a base for further processing of more complex structures. In some embodiments, a mesa has a topographical height feature, providing a capability for vertical isolation and/or size for desired functionality.

As used herein, the term "trench" refers to a space that separates two adjacent elements. It can be a recess formed in the substrate such as by etching, a space on or above the substrate formed for example by depositing two adjacent elements on or above the substrate, or a combination thereof. A trench can be of any shape or size as long as it separates two adjacent elements. In some embodiments, it is deep and/or has a width smaller than a characteristic length.

As used herein, the terms "left" or "right", "top" or "bottom", "horizontal" or "vertical", "upper" or "lower", "lateral" etc., are used to describe features of the exemplary embodiments with reference to the positions of such features as displayed in the figures. They are used for convenience in explanation, and do not limit features in such positions.

As used herein, the term "width" refers to a characteristic dimension, generally along a substantially horizontal direction, of a feature. Examples of such characteristic dimensions include a width of a rib or a ribbon and a diameter of a circular pillar. For irregular or complex geometries, the width may be defined by the square root of the horizontal cross-sectional surface area of such geometries. It will be understood that a fair amount of process variation occurs in the width of the features described herein. Thus, a rib may have a width that deviates within a certain process variation. In such instances, the width of such features is an average width or characteristic width, taking into account this process variation.

As used herein, the term "height" refers to a characteristic dimension, generally along a substantially vertical direction, of a feature. Examples of such characteristic dimensions include the height of an element, which may be defined by the vertical distance between the top surface of the element and the bottom surface of the corresponding trench. It will be understood that a fair amount of process variation occurs in the height of the features described herein. Thus, an element may have a height that deviates within a certain process variation. In such instances, the height of such features is an average height or characteristic height, taking into account this process variation.

As used herein, the term "average" refers to the arithmetic mean value, or some other measure of central tendency, of a characteristic dimension. In some embodiments, the top surface of an element or the bottom surface of a trench has a slope or an arcuate property. For instance, in a case of a circular pillar-like element having an arcuate top surface, the average width is the circumferential mean diameter of the circular pillar-like element and the average height is the circumferential mean height of the circular pillar-like element.

As used herein, the terms "dielectric" and "dielectric materials" refers to a materials that are poor conductors of electricity. As such, in various embodiments in accordance with the present disclosure, a dielectric material is a material that has a dielectric constant of 50 or less, 40 or less, 30 or less, 20 or less, or 10 or less.

As used herein, the term "foundation material" refers to any material that is suitable for growing graphene or promotes graphene growth. In some embodiments, foundation materials are catalytic metals, e.g., Pt, Au, Fe, Rh, Ti, Ir, Ru, Ni, or Cu. In some embodiments, foundation materials are non-metallic materials, such as Si, SiC, non-stoichiometric SiC (e.g., boron doped or otherwise), and other carbon enhanced materials. As used herein, the phrase "carbon enhanced" materials refers to any materials into which carbon has been added.

As used herein, the term "zone" refers to a portion of a substrate, and the portion can be of any size or shape. One zone of a given substrate can have a shape or size substantially the same as another zone of the same substrate or different than another zone of the same substrate. In some embodiments, a zone is spatially separated from adjacent zones of a given substrate. In some other embodiments, unless otherwise specified, a zone partially overlaps with one or more adjacent zones of the given substrate. In some embodiments, a zone includes one or more initial features, such as elements or trenches that have been patterned in the substrate.

As used herein, the term "graphene profile" or the term "profile" used in association with a graphene stack refers to an outermost shape or contour of a given graphene stack. In some embodiments, in which the given graphene stack comprises a plurality of graphene layers and the outermost graphene layer covers or encapsulates the inner graphene layers, the profile or the graphene profile is represented or defined by the contour of the outermost graphene layer. In some embodiments, in which the outermost graphene layer does not cover or encapsulate all the inner graphene layers, the profile or graphene profile is defined collectively by the plurality of graphene layers that constitutes the given graphene stack. In some embodiments, the terms "graphene profile" and "cross-sectional graphene profile" are interchangeable.

As used herein, the term "dopant profile" or the term "profile" when used in association with doping refers to the distribution of dopants within a selected zone in a given substrate. In some embodiments, the distribution of dopants is expressed as a dopant concentration along a line, over a surface or in a region. In some embodiments, the dopant concentration is a time-average or spatial-average concentration.

As used herein the term "non-planar graphene layer" refers to a graphene layer that is not flat. In some embodiments, a non-planar graphene layer refers to a bent graphene layer with a bending angle, a curved graphene layer with a curvature, or a graphene layer with both bent and curved portions.

5.2. Exemplary Substrates

As used herein, the term "substrate" refers to a solid substance generally in a form of a thin slice. The substrate can be planar or flexible, and can comprise dielectric, semiconducting or metallic materials, such as glass, Si, $SiO_2$, SiC, Cu, Ni, or other materials. It can include one layer or multiple layers.

Exemplary dielectric materials include, but are not limited to, glass, silicon dioxide, neoceram, and sapphire.

Exemplary semiconducting materials include, but are not limited to, silicon (Si), silicon carbide (SiC), germanium (Ge), boron nitride (BN), and molybdenum sulfide (MoS).

Exemplary metallic materials include, but are not limited to, copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof.

In some embodiments the substrate comprises a metal foil or a metal slug.

In some embodiments the substrate comprises Si, $SiO_2$, SiC, Cu, Ni, or other materials. In some embodiments, the substrate substantially comprises neoceram, borosilicate glass, germanium arsenide, a IV-V semiconductor material, a substantially metallic material, a high temperature glass, or a combination thereof.

In some embodiments, the substrate is made of glass. Any of a wide variety of glasses can be used to make the substrate, some of which are described here. In some embodiments, the substrate is made of silicon dioxide ($SiO_2$) glass. In some embodiments, the substrate is made of soda lime glass formed from silicon dioxide, soda (e.g., sodium carbonate $Na_2CO_3$), or potash, a potassium compound, and lime (calcium oxide, CaO). In some embodiments, the substrate is made of lead glass, such as lead crystal or flint glass. In some embodiments, silicon dioxide glass doped with boron, barium, thorium oxide, lanthanum oxide, iron, or cerium(IV) oxide is used to make the substrate. In some embodiments, the substrate is made of aluminosilicate, borosilicate (e.g., PYREX®, DURAN®, SIMAX®), dichroic, germanium/semiconductor, glass ceramic, silicate/fused silica, soda lime, quartz, or chalcogenide/sulphide.

In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoroethylene, polymethacrylate, nylon 6,6, cellulose acetate butyrate, cellulose acetate, rigid vinyl, plasticized vinyl, or polypropylene.

In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry. In some embodiments the substrate is crystalline (e.g., mono-crystalline or polycrystalline).

In some embodiments, a substrate comprises multiple layers, each with a different material. In some embodiments, a layer of another composition is applied onto the substrate. In some embodiments, the substrate has crystallographic symmetry.

When referring to multiple layers, the term "substrate" is equivalent to and interchangeable with the term "substrate stack."

5.3. Devices and Methods

FIGS. 1A-1E provide graphical representations of exemplary graphite-based devices with non-planar graphene layers, in accordance with some embodiments of the present disclosure. In various embodiments, exemplary graphite-based devices include a substrate (e.g., 102) comprising a plurality of zones (e.g., 102-1, 102-2), with one or more graphene stacks (e.g., 104-1, 104-2) formed in a selected zone or zones. In some embodiments, a substrate is a non-patterned substrate. In many embodiments, the substrate 102 is a patterned substrate with initial features such as elements, trenches, holes, and recesses. In such embodiments, a selected zone can include one or more initial features, and a graphene stack can be formed either on a surface of the substrate or on the initial features. By way of illustration, FIG. 1A-1E depict the patterned substrate 102 comprises an element (e.g., 108) and a recess of a truncated cone shape (e.g., 110); some graphene stacks (e.g., 104-1, 104-2) are formed on the element or the recess and some (e.g., 104-3, 104-4) are formed on a surface of the substrate. More description of substrates in accordance with the present disclosure are found in Section 5.2, above.

In some embodiments, only one selected zone in the plurality of zones comprises one or more graphene stacks and other zones in the plurality of zones do not comprise any graphene stacks. In some embodiments, more than one zone comprises a graphene stack. In some embodiments, one or more selected zones comprise more than one graphene stacks. In some embodiments, graphene stacks are formed in each zone in the plurality of zones.

By way of illustration, FIGS. 1A-1C depict the graphene stack 104-1 formed in the zone 102-1, the graphene stack 104-2 formed in the zone 102-2, and two graphene stacks 104-3, 104-4 formed in the zone 102-3. Adjacent graphene stacks, either formed in one zone or in adjacent neighboring zones, can be spatially separated from each other or functionally separated from each other by boundary conditions. As an example, FIGS. 1A-1E depict the graphene stacks 104-1, 104-2 that are spatially separated from each other and the graphene stacks 104-3, 104-4 that form a physical contact but are functionally separated by boundary conditions.

In various embodiments, a graphene stack comprises at least one non-planar graphene layer that can be characterized by a bending angle, a curvature, a characteristic dimension, a graphene orientation, a graphene type, or any combination of these or other characteristics. For instance, in some embodiments, a graphene stack comprises a graphene layer with a first portion overlaying a first surface in a selected zone and a second portion overlaying a second surface in the same selected zone. The first and second surfaces are adjacent to each other but are not on the same common plane, resulting in a non-planar graphene layer with a bending angle formed between the first portion and the second portion of the graphene layer. In some embodiments, the first portion of the graphene layer overlays a portion of the first surface or the second portion of the first graphene layer overlays a portion of the second surface. In some embodiments, the first portion of the first graphene layer overlays the entire first surface or the second portion of the first graphene layer overlays the entire second surface.

As an example, FIGS. 1B-1C illustrate the graphene stack 104-1 comprising a non-planar graphene layer 106-1, which is bent, with a first portion formed on a top surface of the element 108 and a second portion formed on a side wall of the element 108. The first and second portions of the graphene layer 106-1 form a bending angle, indicated by $\alpha 1$ in FIG. 1B.

In some embodiments, the non-planar graphene layer 106-1 has a characteristic dimension along a lateral direction, such as the characteristic dimension (e.g., width) D1 illustrated in FIG. 1C. Such configurations have several advantages. For example, in some embodiments where the element 108 is tall, the portion of the graphene layer 106-1 overlaying the side wall of the element 108 can be very long, resulting in a large workable or functional surface area for performing electronic or photonic functionalities. In many cases, workable or functional surface area surpasses the physical surface, thus enhancing the functionalities such as efficiency of solar devices. Meanwhile, the bandgap of the graphene layer 106-1 can be tuned by the control or variation of the characteristic dimension (e.g., width) D1 along the lateral direction y.

In some embodiments, a graphene stack comprises a curved graphene layer with a curvature. In general, the curvature in the present disclosure refers to the normal curvature or the mean curvature of a given surface or a given graphene layer. In some embodiments, a curved graphene layer is formed as a result of overlaying on a curved surface in the selected zone. The curved surface can be a surface of the substrate or a surface of a feature formed in the substrate. In some embodiments, the curved surface is a circumferential surface of an element, a pillar, a trench, a hole, a recess, a cavity or other features formed in the substrate. In some embodiments, the curved surface is concave, convex, or a combination of a concave and convex shape.

For instance, FIGS. 1A, 1B and 1D illustrate the graphene stack 104-2 comprising a non-planar graphene layer 106-2 that overlays a circumferential surface of a truncated cone 110. The curvature of the graphene layer 106-2 is indicated by $r_1$ in FIG. 1B, which in many cases, is substantially the same as the curvature of the circumferential surface of the truncated cone 110. In some embodiments, the graphene layer 106-2 has a characteristic dimension that substantially equals the length or height of the circumferential surface of the truncated cone 110, as indicated by D2 in FIG. 1D. Such or similar configurations can be used to design a variety of devices including self centering devices, tracking solar cells, reflection or concentration devices and antenna arrays.

In some embodiments, a non-planar graphene layer is characterized by other characteristics, such as the graphene orientation or the graphene type. For instance, FIGS. 1A-1B depict that each of the graphene stacks 104-3, 104-4 formed in the zone 102-3 comprises a plurality of graphene layers.

The bending angles or curvatures of graphene layers 106-3, 106-4 are substantially the same, but the orientations of these two graphene layers are different. A graphene layer can also differ from another graphene layer in type. Different types of graphene can be achieved, for instance, by using different foundation materials or by doping with different dopants or different dopant concentrations. Different types of graphene can also be achieved, for instance, by using different crystalline foundation materials each having a different crystalline nature. This applies to metals and SiC and some other foundation materials. When different graphene layers, for example, in different types or in different orientations, come into physical contact, boundary conditions are generally formed at the intersection, which functionally separate the graphene layers from each other. More description of boundary conditions and their formation can be found in, for example, U.S. Provisional Application No. 61/775,479, the entire contents of which is hereby incorporated by reference herein in its entirety.

In some embodiments, a graphene stack (e.g., 104-1) formed in one zone (e.g., 102-1) is substantially the same as a graphene stack (e.g., 104-4) formed in another zone (e.g., 102-4). That is, the graphene layer 106-1 of the graphene stack 104-1 has substantially the same characteristics as the graphene layer 106-5 of the graphene stack 104-4. In some embodiments, a graphene layer differs from another graphene layer in at least one of the aforementioned characteristics or other characteristics. Such different graphene layers can be present in the same graphene stack. For instance, the graphene stack 104-4 comprises a plurality of graphene layers, in which the graphene layer 106-4 is curved and the graphene layer 106-5 is flat. In addition, the graphene layer 106-4 has a different characteristic dimension than the graphene layer 106-5. Different graphene layers can also be present in different stacks or in different zones. For instance, the graphene layer 106-1 of the graphene stack 104-1 formed in the zone 102-1 has at least a different bending angle, a different curvature, and a different graphene orientation than the graphene layer 106-2 of the graphene stack 104-2 formed in the zone 102-2.

Graphite-based devices of the present disclosure can have a wide variety of configurations to achieve desired functionalities for various applications. In many embodiments, exemplary graphite-based devices comprise non-planar graphene layers such as bent, curved, or a combination of bend and curved graphene layers. In some embodiments, a bent graphene layer overlays two or more surfaces that do not reside on a common plane. In some embodiments, a curved graphene layer overlays on a non-planar surface in a selected zone. In some embodiments, graphene layers are configured to provide additional functional surface areas to increase efficiency or other functionalities. In some embodiments, a plurality of graphene layers are stacked together and collectively form a graphene profile with different characteristic dimensions, producing the devices with multiple functionalities. In some embodiments, the outermost graphene layer covers or encapsulates the inner graphene layers, and thus serves as a protection to the inner graphene layers. In some embodiments, a graphene layer has a portion overhanging, abutting or joining another adjacent graphene layer, and is separated from the adjacent graphene layer by boundary conditions at a butting or joining intersection.

Figure 2A:
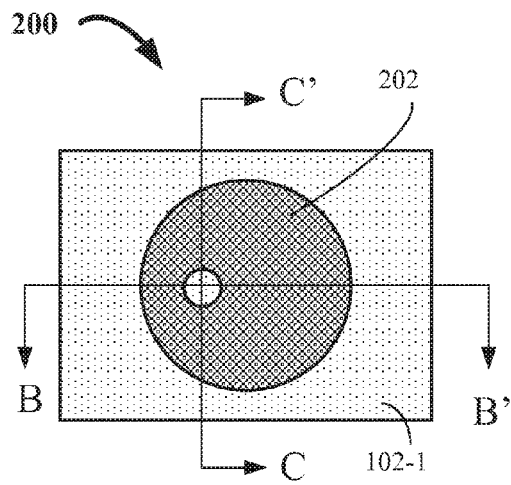
Figure 2D:
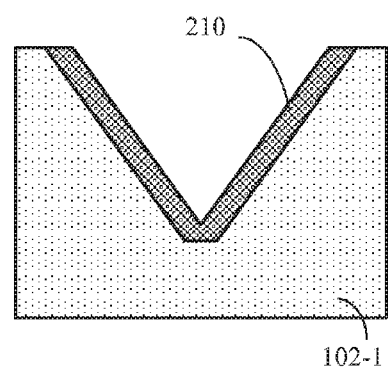
Figure 2B:
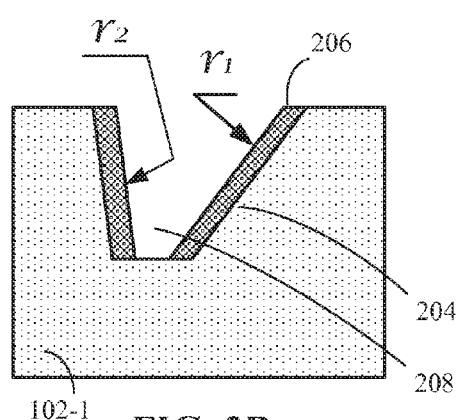
Figure 2E:
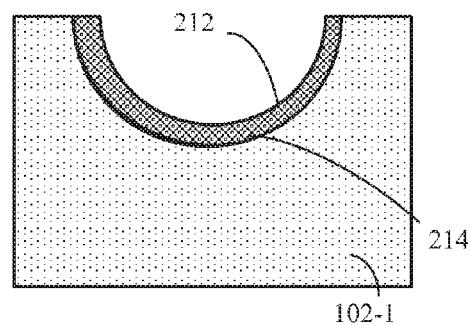
Figure 2C:
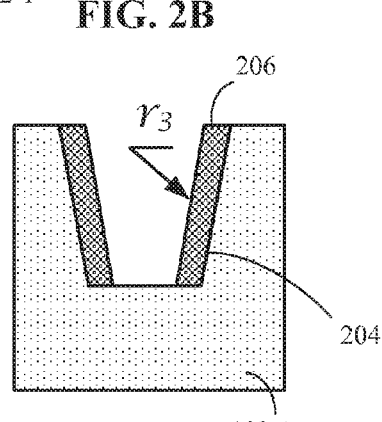
Figure 2F:
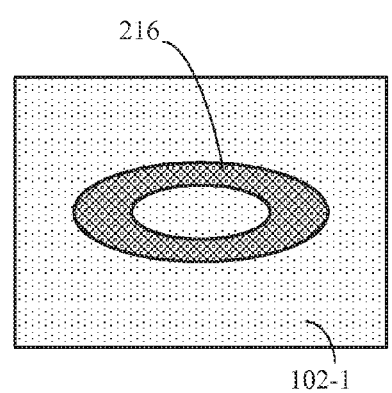

As an example, FIGS. 2A-2F illustrate exemplary graphite-based devices comprising curved graphene layers formed on a non-planar surface in a feature that has been patterned in the substrate. In some embodiments the feature is a trench, a hole, a recess or a cavity, which can be of any suitable shape and size. In some embodiments, it is a right circular truncated cone as illustrated in FIGS. 1A-1B and 1D. In some embodiments, it is oblique, elliptic, parabolic, or not truncated. As illustrated in FIGS. 2A-2C, in some embodiments, a graphene stack (e.g., 202) in a selected zone (e.g., 102-1) comprises a non-planar graphene layer (e.g., 206) that overlays a circumferential surface (e.g., 204) of a truncated oblique cone (e.g., 208). Because of the obliqueness, the curvature of the circumferential surface (e.g., 204) of the truncated oblique cone (e.g., 208) is not constant. Consequently, the curvature of the non-planar graphene layer (e.g., 206) varies at different locations, examples of which are indicated by $r_1$, $r_2$, $r_3$ in FIGS. 2A-2B. In some embodiments, the cone is not truncated, as illustrated in FIG. 2D. In some embodiments, the cone is not circular. For example, FIG. 2E depicts a section view of a non-planar graphene layer 212 overlaying a parabolic surface 214, and FIG. 2F depicts a top view of a graphene layer 216 overlaying a circumferential surface of an elliptical cone.

Figures 3A, 3D:
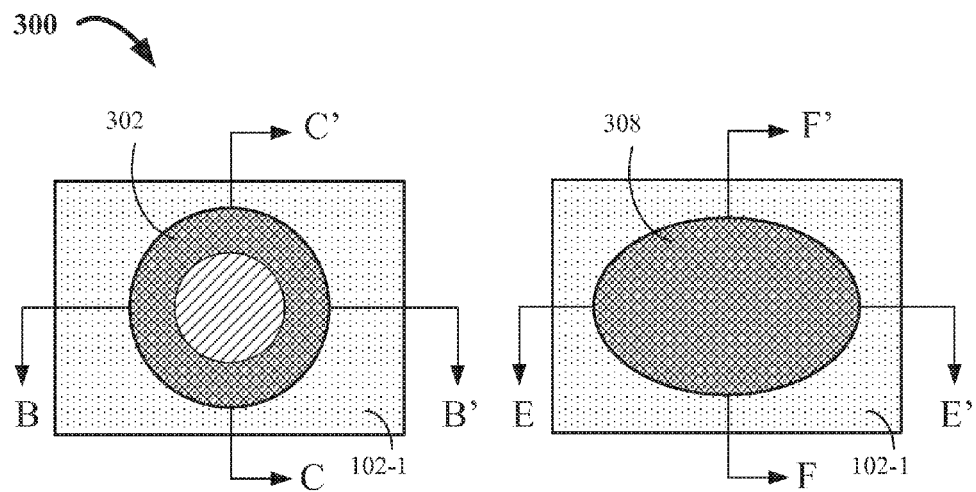
Figures 3B, 3E:
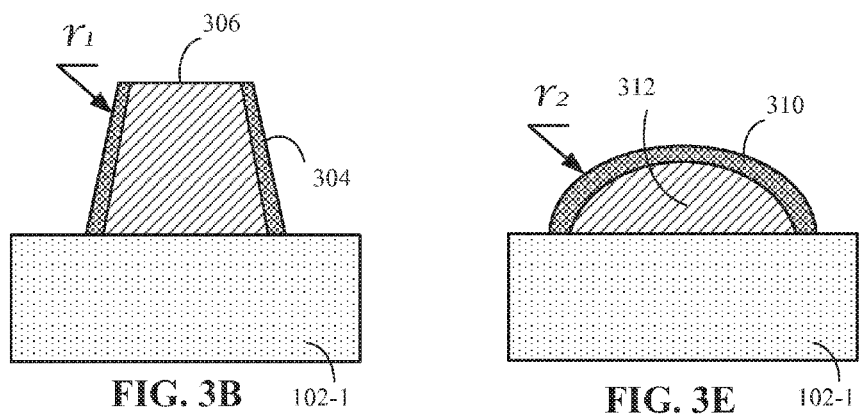
Figures 3C, 3F:
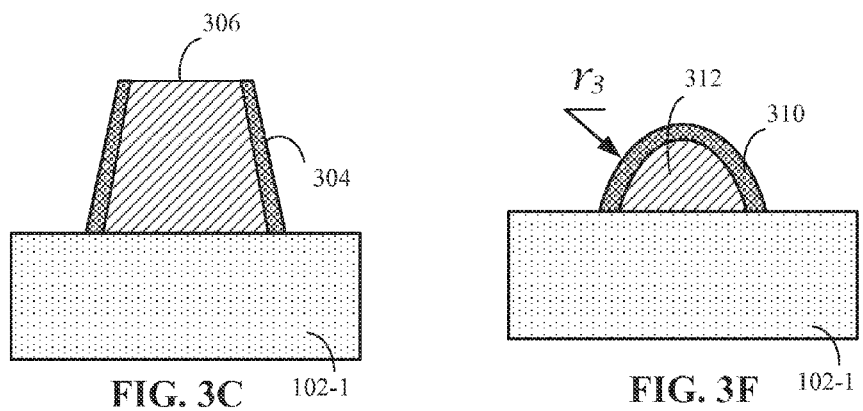

In some embodiments, a non-planar graphene layer is formed on a non-planar surface of an element that has been patterned in a selected zone. For instance, FIGS. 3A-3C illustrate a graphene stack 302 comprising a non-planar graphene layer 304 that overlays a circumferential surface of an element 306 in the zone 102-1. In the illustrated embodiment, the element 306 has a truncated circular cone shape. FIGS. 3D-3F illustrates another example, in which a graphene stack 308 comprises a non-planar graphene layer 310 that overlays the entire surface of an element 312 in the zone 102-1. In the illustrated embodiment, the element 312 has an elliptic dome shape, producing the non-planar graphene layer 310 with varied curvature, indicated by $r_2$, $r_3$ in FIGS. 3E-3F. Like the forgoing discussion, the elements (e.g., 306, 312) can have various configurations, depending on the applications and desired functionalities.

Figure 4A:
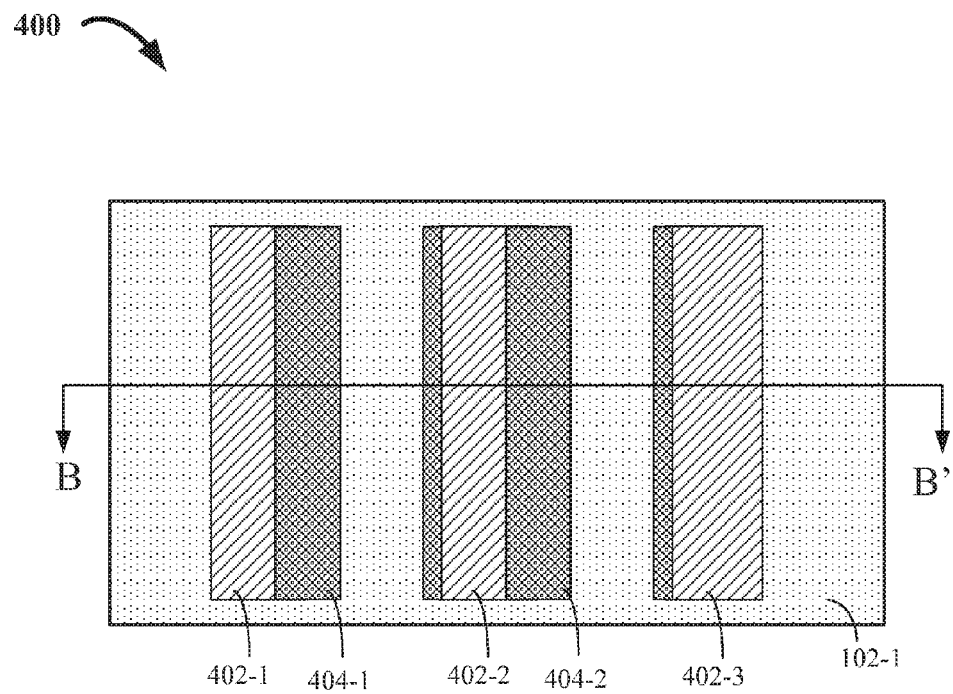
Figure 4B:
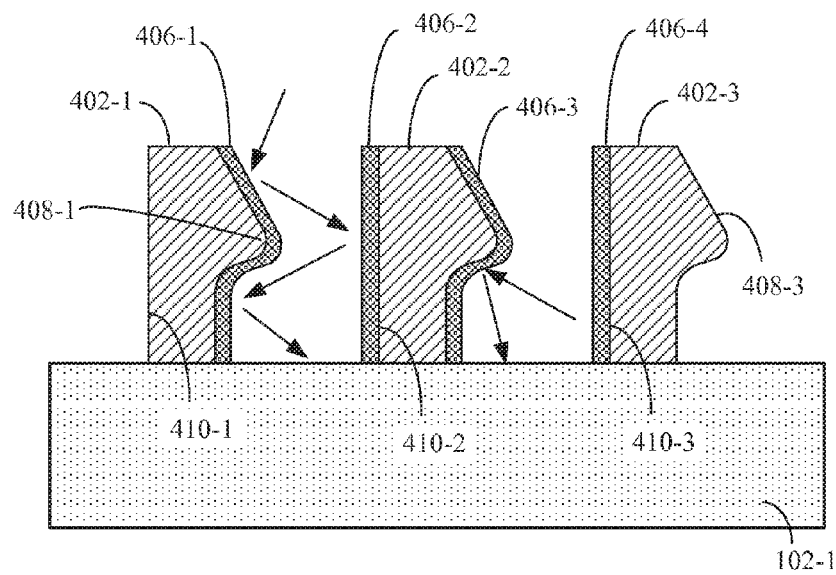

In some applications, asymmetric or irregular non-planar graphene layers are desired. For instance, in structural antenna applications, non-planar graphene layers with asymmetric focus structures are very desirable. Examples of such configurations are graphically illustrated in FIGS. 4A-4D. In FIGS. 4A-4B, a graphene stack comprises two graphene layers, one formed on a non-planar surface and the other formed on a flat surface. For instance, the graphene stack 404-1 comprises the non-planar graphene layer 408-1 and the flat graphene layer 408-2. The non-planar graphene layer 408-1 is formed on an irregular surface 406-1 of the element 402-1 and the flat graphene layer 408-2 is formed on a flat surface 408-2 of the element 402-2. Collectively, these two graphene layers form an asymmetric graphene stack that can redirect or concentrate photons into the substrate or other desired locations, as indicated by the arrows in FIG. 4B.

Figure 4C:
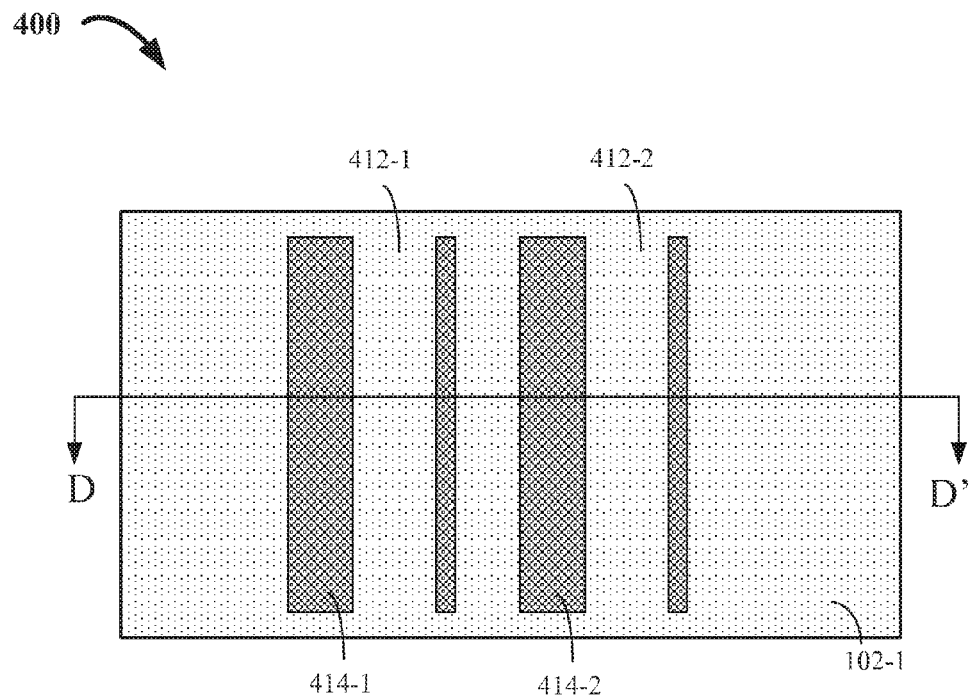
Figure 4D:
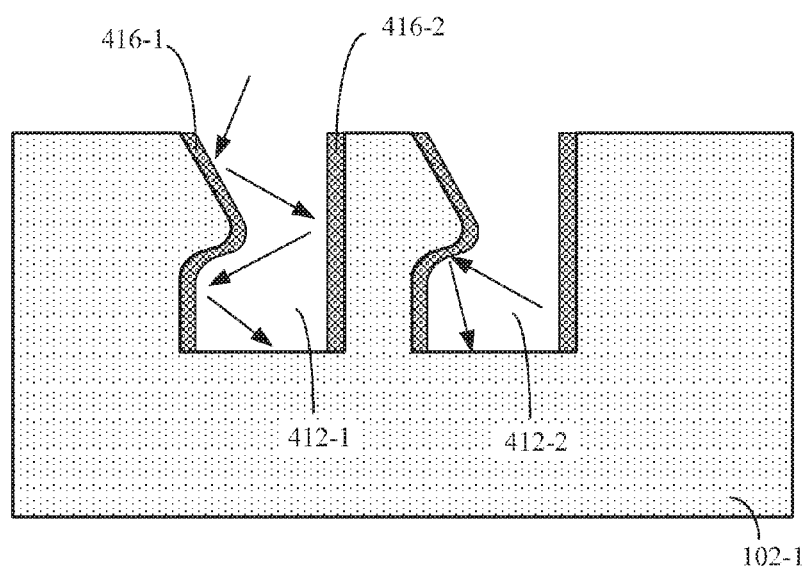
Figure 6A:
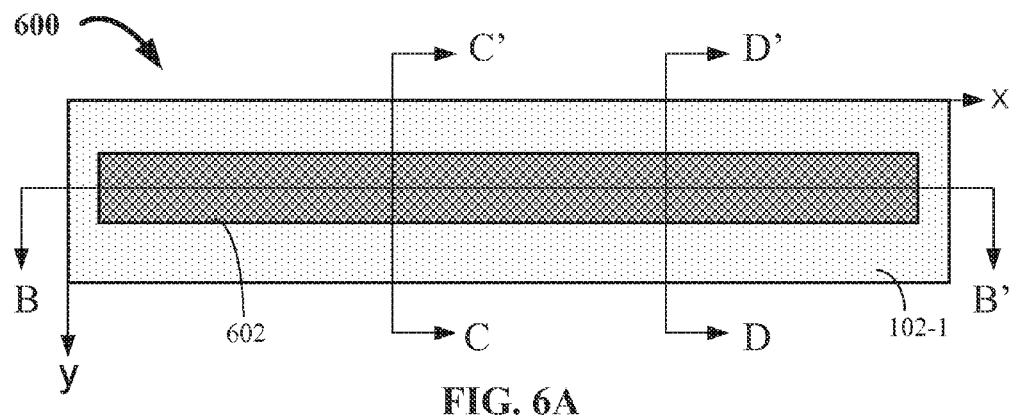
Figure 6B:
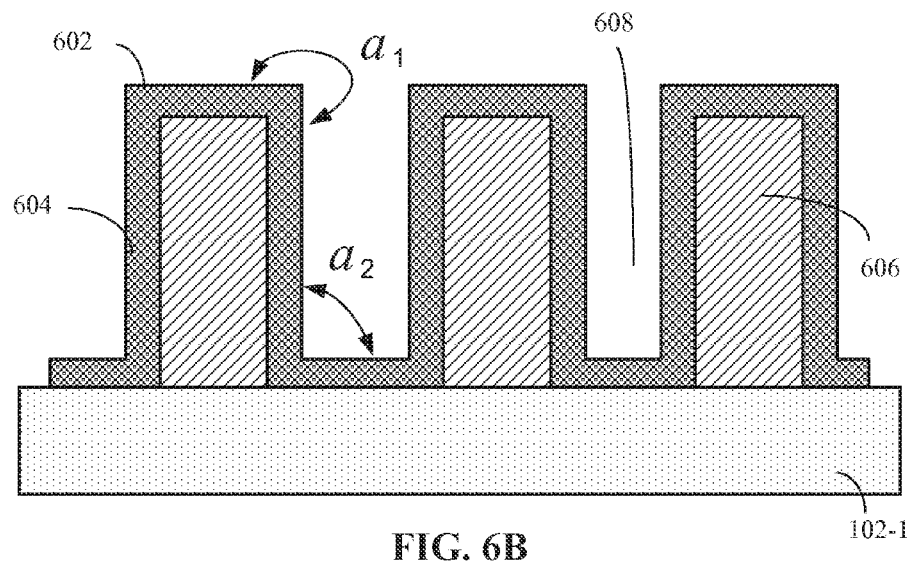
Figure 6C:
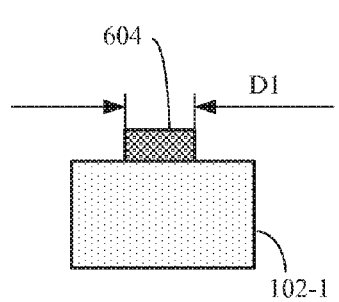
Figure 6D:
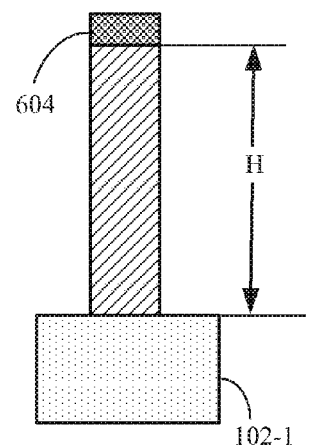

In some embodiments, the asymmetric or irregular non-planar graphene stacks or structures are formed in trenches, recesses, or cavities that have been patterned in the substrate. For example, FIGS. 4C-4D illustrate the asymmetric graphene stack 414-1 comprising the graphene layers 416-1, 416-2 that are formed on side walls of the recess or cavity 412-1. The graphene layer 416-1 can be configured to have the same characteristics as the graphene layer 406-1. Likewise, the graphene layer 416-2 can be configured to have the same characteristics as the graphene layer 406-2. As a result, the graphene layers 416-1, 416-2 can perform the same functionalities as the graphene layers 406-1, 406-2, despite the graphene layers 416-1, 416-2 overlying on side walls of a recess or cavity.

FIGS. 5A-5E illustrate exemplary graphite-based devices with bent graphene layers in various configurations. In some embodiments, a non-planar graphene layer overlays onto two adjacent surfaces that are not on a common plane, such as the graphene layer 506 overlaying the top surface 504-2 and a side wall 504-1 of the element 502 in FIG. 5A. In some embodiments, a non-planar graphene layer overlays onto three or more adjacent surfaces that are not on a common plane, such as the graphene layer 506 overlaying the top surface 504-2 and two side walls 504-1, 504-3 of the element 502 in FIG. 5B.

In some embodiments, a non-planar graphene layer overlays the entire top surface and side walls of the element as illustrated in FIG. 5D, covering or encapsulating the element. Such configurations provide large workable or functional surface areas for the devices, in particular when the element is tall. In some embodiments, the height H of an element can range between several nanometers to several micrometers. In addition, such configurations allow the formation of physical or electrical connection or communication between a graphene layer and other components in the devices. For instance, FIG. 5E illustrates the formation of connection between the non-planar graphene layer 506 with an oxidized layer 508 at one edge and with a lead 510 at the other edge. In some embodiments in which the graphene layer 506 is generated after the deposition of the lead 510, each graphene sheet in the graphene layer 506 contacts the lead 510, thus providing the devices with a solid and high quality connection.

In some embodiments, an element is undercut to provide additional surface areas for the formation of functional graphene layers. Two examples are illustrated in FIGS. 5A and 5B, respectively. As a result of undercutting, the graphene layer 506 in FIG. 5A forms a pointed intersection or a stress intersection with a reflex bending angle $\alpha 1$ that is generally over 270 degrees. However, undercutting does not necessarily produce a reflex bending angle. For instance, undercutting in FIG. 2B produces an obtuse angle $\alpha 2$ that is between 180 degrees and 270 degrees.

In some embodiments, an element is configured to have a curved surface to provide additional surface areas for the formation of functional graphene layers. An example is illustrated in FIG. 5C, in which the graphene layer 506 overlays the top surface 504-2 and a side wall 504-1 and a curved surface 504-3 of the element 502. As a result, the graphene layer 506 in FIG. 5C has a bent portion and curved portion, and can be characterized by the bending angle $\alpha 3$ or the curvature $r1$, or a combination of the bending angle and the curvature.

FIGS. 6A-6D illustrates another exemplary graphite-based device with bent graphene layers. In FIGS. 6A-6D, a selected zone 102-1 comprises a plurality of features, such as elements 606 and trenches 608, that has been patterned in the substrate. The graphene stack 602 comprises a graphene layer 604 that is formed on the top surfaces and side walls of all elements and on the bottom surfaces of all trenches in the selected zone 102-1. The graphene layer 604 is continuous and long in one lateral direction such as the lateral direction x. Along another lateral direction such as the lateral direction y, the elements and trenches can be configured to have a characteristic dimension such as D1 to achieve desired bandgaps or desired functionalities.

Configurations illustrated in FIGS. 5A-5E and 6A-6D advantageously provide large workable or functional surface areas. In many cases, the workable areas surpass the underlying physical surface areas, particularly when the elements are tall relative to their width. Consequently, such configurations provide additional workable surface areas for performing electronic or photonic functions, thereby enhancing functionalities of devices such as efficiency of solar cells or photodetectors. In addition, the elements provide structural supports to the graphene layer, resulting in the exemplary devices of the present disclosure having a high quality and integrity.

Graphite-based devices of the present disclosure with bent graphene layers can have other configurations. For instance, FIGS. 7A-7F illustrate bent graphene layers formed on features, such as elements with pillar or pyramid shapes, which have been patterned in a substrate. In some embodiments, a non-planar graphene layer comprises a plurality of portions, with each respective portion overlaying a corresponding side wall of the element, such as the graphene layer 702 in FIGS. 7A-7C overlaying all side walls of the element 704. A bending angle is formed between two portions of the graphene layer overlaying on two adjacent side walls, as indicated by $\alpha 1$ in FIG. 7C. In some embodiments, a portion of the non-planar graphene layer, such as the graphene layer 706 in FIGS. 7D-7F, overlays on a top surface of the element. Another bending angle is formed between the portions of the graphene layer overlaying on the top surface and on a side wall, as indicated by $\alpha 2$ in FIG. 7F.

Figures 7A, 7D:
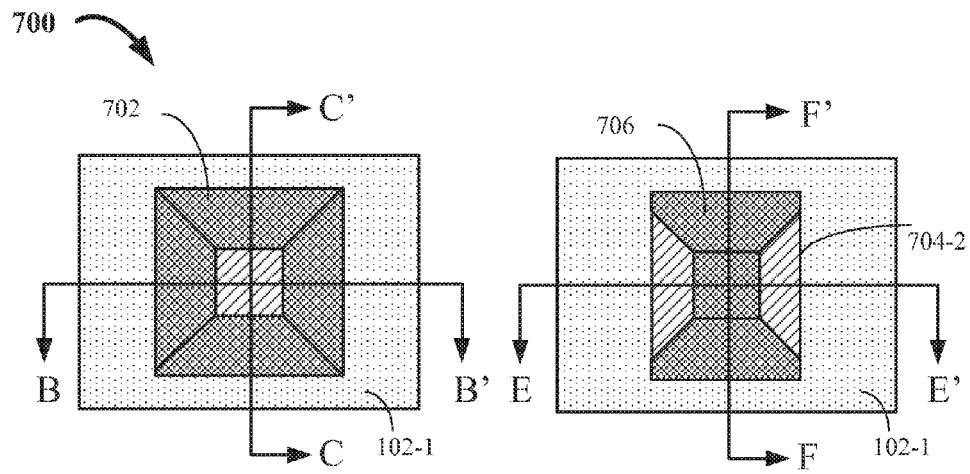
Figure 7B:
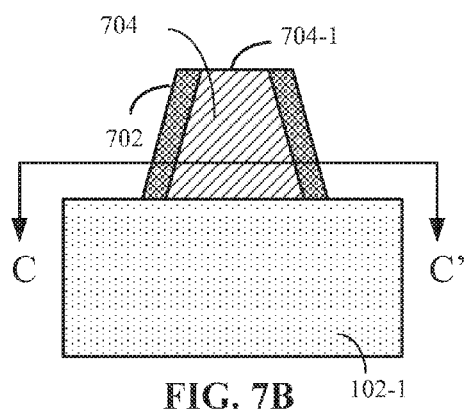
Figure 7E:
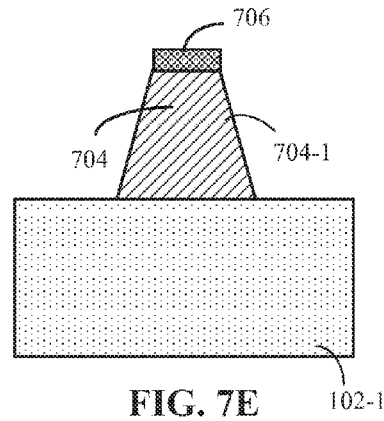
Figure 7C:
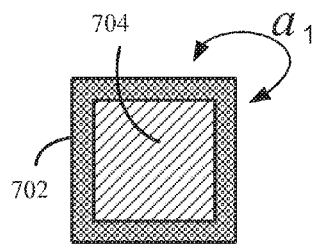
Figure 7F:
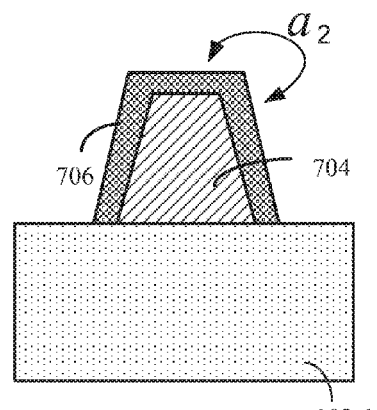

In some embodiments, the top surface, such as 704-1 in FIG. 7B, or one or more side walls of the element, such as 704-2 in FIGS. 7D-7E, are not occupied by a graphene layer. Unoccupied top surfaces or side walls of an element can be used for other purposes, for instance, accompanying other components of the devices such as a lead for the formation of electrical communication with the graphene layer.

FIGS. 8A-8F illustrate bent graphene layers formed on features such as recesses or cavities with pillar or pyramid shapes that have been patterned in a substrate. Similar to the embodiments in FIGS. 7A-7F, a non-planar graphene layer can comprise a plurality of portions, with each respective portion overlaying a corresponding side wall of a recess or cavity. A bending angle is formed between two portions of the graphene layer overlaying on two adjacent side walls, as indicated by $\alpha 1$ in FIG. 8A. In some embodiments, one or more side walls of the recess or cavity are not occupied by a graphene layer and can be used for accompanying other components of the devices, such as a lead for the formation of electrical communication with the graphene layer. Examples of such embodiments are illustrated in FIGS. 8C-8D. In some embodiments, the side walls of the recess or cavity are tapered or undercut, as illustrated in FIGS. 8E-8F. Graphene layers formed on such side walls in general are slanted with respect to a surface of the substrate.

In some embodiments, bent graphene layers are compressed, forming one or more compression points or compression intersections. For instance, FIGS. 9A-9C illustrate bent graphene layers formed on a trench 902. In the illustrated embodiments, the graphene layers (e.g., 906, 908) include portions overlaying on the bottom surface and side walls of the trench 902 as well as a portion or portions overlaying on a surface (e.g., 904) of the substrate in the selected zone 102-1. In some embodiments, the graphene layer (e.g., 908) is thick, for instance, having a thickness that is approximately equal to the half of the trench width. In such embodiments, the graphene layer (e.g., 908) fills the trench and is squeezed, forming a compression point or compression intersection as indicated by reference number 912 in FIG. 9B. In some embodiments, a plurality of graphene layers (e.g., 910-1, 910-2, 910-3) are formed in the trench, with a first graphene layer (e.g., 910-1) overlaying the bottom and side walls of the trench as well as the surface (e.g., 904) of the substrate in the zone 102-1 and other graphene layers overlaying on top of each other. Like the graphene layer 908, in some embodiments, the plurality of graphene layers fills the trench and is squeezed, forming a compression point or compression intersection as illustrated in FIG. 9C.

In various embodiments, graphite-based devices of the present disclosure comprise a graphene stack with a plurality of graphene layers that collectively form a graphene profile. In many embodiments, one graphene layer in the plurality of graphene layers is non-planar and the plurality of graphene layers has different characteristic dimensions, producing the devices with multiple functionalities. For instance, FIG. 10A illustrates a graphene stack 1002 comprising two graphene layers 1004-1, 1004-2. The first graphene layer 1004-1 overlays on the first surface 1006-1 in the selected zone 102-1. The second graphene layer 1004-2 has a first portion overlaying the first graphene layer 1004-1, and a second portion overlaying an adjacent second surface 1006-2 in the selected zone 102-1. Although the first and second surfaces illustrated in FIG. 10A are flat and on the same common plane, these are not necessary requirements. The first or second surface can be non-planar, on an element, or in a trench. The second graphene layer 1004-2 further comprises an intermediate or transition portion 1008 between the first and second portions, which is in general bent or curved and can be characterized by a bending angle or a curvature. The intermediate or transition portion 1008 connects the first and second portion, producing an unbroken and continuous graphene layer. In many embodiments, the second graphene layer 1004-2 has a different characteristic dimension than the first graphene layer 1004-1.

In some embodiments, as illustrated in FIG. 10B, the graphene stack 1002 further comprises a third graphene layer 1004-3, which has a first portion overlaying the second graphene layer 1004-2 and a second portion overlaying a third surface 1006-3 in the selected zone 102-1. The third surface is adjacent to the second surface 1006-2, but does not necessarily on the same plane as the second surface. Similar to the second graphene layer 1004-2, the third graphene layer also comprises intermediate or transition portion 1010 that connects the first and second portions of the third graphene layer. In some embodiments, the graphene stack 1002 further comprises one or more graphene layers overlaying on top of the third graphene layer 1004-3. In many embodiments, the first portion of the third graphene layer 1004-3 that overlays the second graphene layer 1004-3 is curved or bent.

FIG. 10C illustrates another graphite-based device of the present disclosure that comprise a graphene stack with a graphene profile. In the illustrated embodiment, the graphene stack 1012 comprises three graphene layers 1014-1, 1014-2, and 1014-3. The first graphene layer 1014-1 overlays the first surface 1006-1 and the second graphene overlays the third surface 1006-3. The third surface is separated from the first surface by the second surface 1006-2. The first and second graphene layers can be either the same or different from each other in the characteristic dimension, thickness, or other parameters. The third graphene layer 1014-3 comprises a first portion that overlays on the first graphene layer 1014-1, a second portion that overlays the second surface 1006-2, and a third portion that overlays the second graphene layer 1014-2. The third graphene layer 1014-3 also comprises a first transition portion 1016-1 between the first and third portions of the third graphene layer and a second portion 1016-2 between the second and third portions of the third graphene layer.

In some embodiments, the first and second transition portions have substantially the same bending angle or curvature. In some embodiments, the first and second transition portions have different bending angles or curvatures. In some embodiments, the first and third surfaces are very close to each other. In such embodiments, the first and second transition portions of the third graphene layer are squeezed, forming a compression point or compression intersection. In some embodiments, the graphene stack 1012 further comprises one or more graphene layers overlaying on top of the third graphene layer 1014-3.

Graphite-based devices of the present disclosure can comprise a graphene stack or graphene stacks with various other graphene profiles. In some embodiments, a graphene stack has a smooth shape, a stepwise shape, a concave shape, or a convex shape. In some embodiments, a graphene stack has a shape like a ribbon, a pillar, a dot, a cup, a cone, or a dome. In some embodiments, a graphene stack comprises a plurality of graphene layers with different characteristic dimensions along one lateral direction but with substantially a same characteristic dimension along another lateral direction. In some embodiments, the outermost graphene layer covers or encapsulates the inner graphene layers, and thus serves as protection to the inner graphene layers. In some embodiments, a graphene layer has a portion overhanging, abutting or adjoining another adjacent graphene layer, and is separated from the adjacent graphene layer by boundary conditions at an abutting or adjoining intersection. More information on graphene or graphite-based devices can be found in, for example, U.S. Provisional Application No. 61/775,479, the entire contents of which is hereby incorporated by reference herein in its entirety.

In some embodiments, a graphite-based device of the present disclosure comprises 1, 2, between 2 and 10, 10, between 10 and 100, 100, between 100 and 1000, 1000, or over 1000 graphene stacks. In some embodiments, each selected zone comprises 1 graphene stack. In various embodiments, each selected zone comprises between 2 and 10, 10, between 10 and 100, 100, between 100 and 1000, 1000, or over 1000 graphene stacks. In some embodiments, each graphene stack is substantially the same as other graphene stacks generated in the same selected zone or in the same substrate.

Figure 11A:
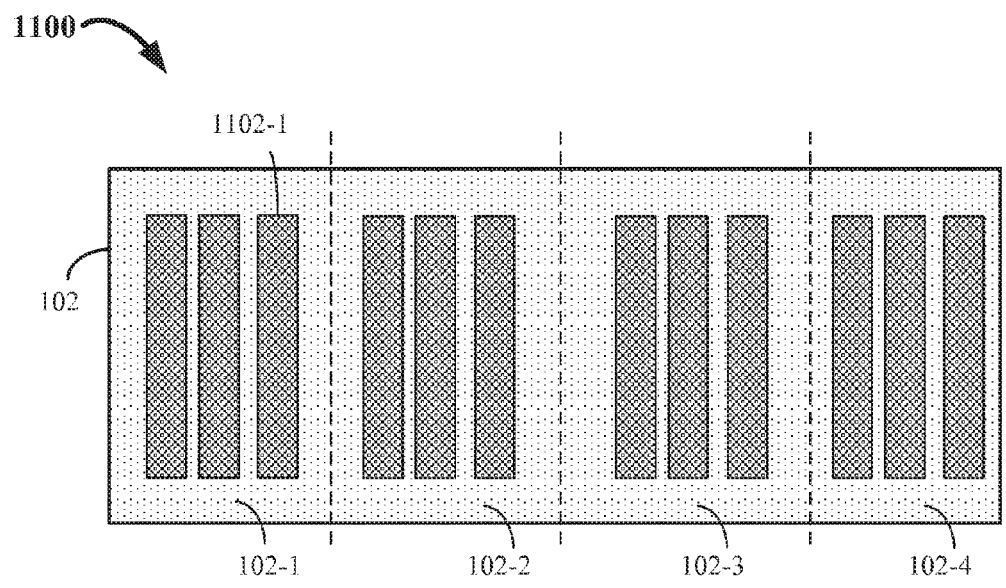

For example, FIG. 11A illustrates a graphical representation of an embodiment that comprises a plurality of graphene stacks (e.g., 1102-1) with substantially the same ribbon-like shape. In some embodiments, graphene stacks generated in the same selected zone are different. In some cases these graphene stacks form physical contacts but are functionally separated from each other by boundary conditions, as illustrated by the graphene stacks 1102-7, 1102-8 in the zone 102-2 and the graphene stacks 1102-9, 1102-10 in the zone 102-3 (illustrated in FIG. 11D). In some embodiments, each graphene stack generated in one zone is different than other graphene stacks generated in other zones, such as graphene stacks 1102-3, 1102-4, 1102-5, 1102-6, illustrated in FIG. 11C.

Figure 11B:
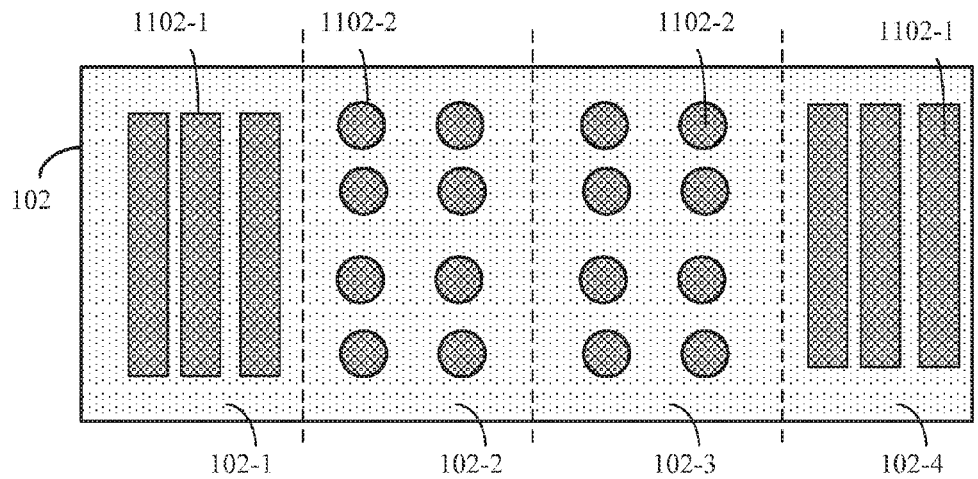
Figure 11C:
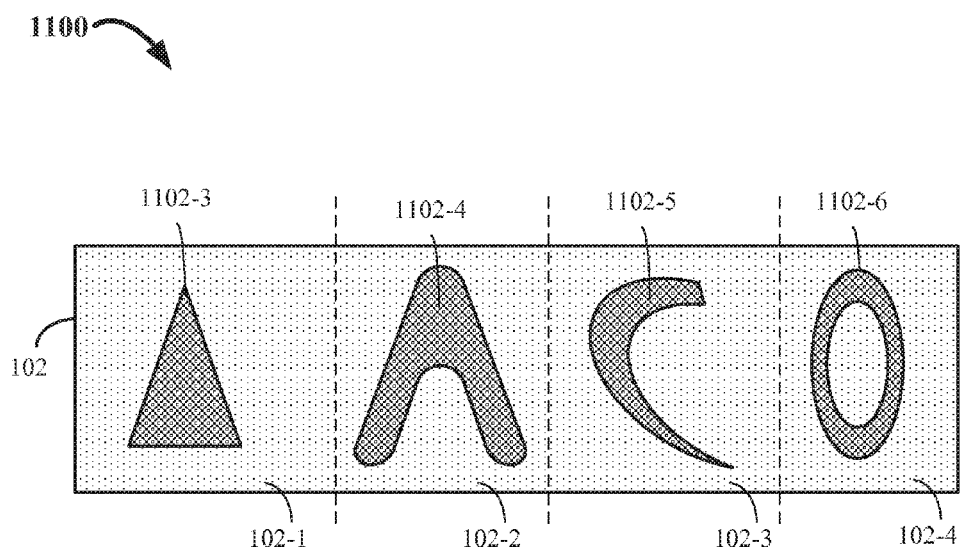
Figure 11D:
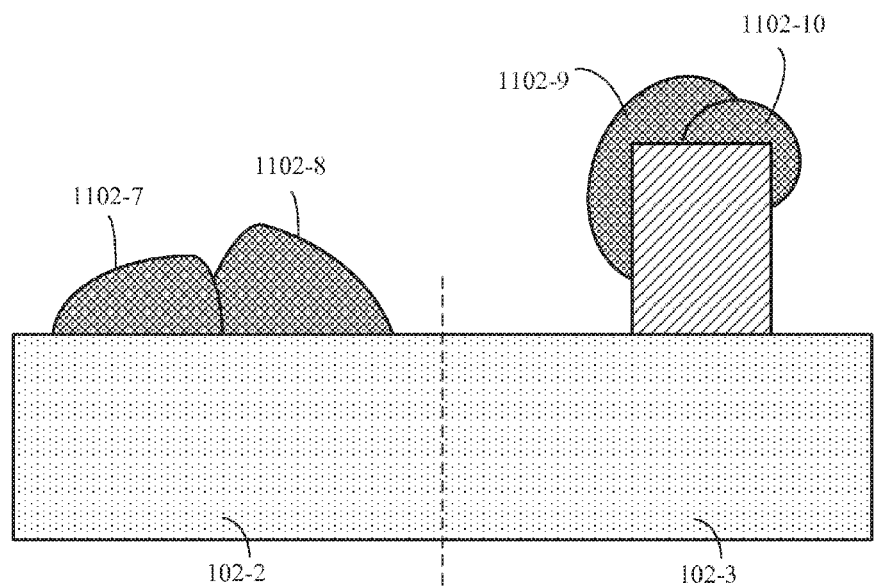

In some embodiments, a first plurality of graphene stacks (e.g., first set) generated in one or more zones is different than a second plurality of graphene stacks (e.g., second set) generated in another zone or zones and thus the first set performs different functionalities than the second set. For instance, FIG. 11B illustrates a first plurality of graphene stacks 1102-1 generated in zones 102-1, 102-4 with a ribbon-like shape and a second plurality of graphene stacks 1102-2 generated in zone 102-2, 102-3 with a dot-like or dome-like shape. Moreover, in some embodiments, a graphene stack or each graphene stack in the first set or in the second set comprises a plurality of graphene layers with varied characteristic dimensions. In such embodiments, the single graphene stack itself performs multiple functionalities.

In some embodiments, a graphene stack comprises a non-planar graphene layer that is characterized by a bending angle. In some embodiments, the bending angle is an acute bending angle, a substantially right bending angle, an obtuse bending angle, or a reflex bending angle. In some embodiments, the bending angle is between 0.5 degrees and 10 degrees, between 10 degrees and 45 degrees, between 45 degrees and 180 degrees, or between 180 degrees and 230 degrees. In some embodiments, the bending angle does not exceed 180 degrees. In some embodiments, the bending angle is over 180 degrees, about 270 degrees, or over 270 degrees.

In some embodiments, a graphene stack comprises a non-planar graphene layer that is characterized by a curvature. In some embodiments, the non-planar graphene layer has a concave shape with a negative curvature. In some embodiments, the non-planar graphene layer has a convex shape with a positive curvature. In some embodiments, the non-planar graphene layer has a bend portion and a curved portion. In some embodiments, the non-planar graphene layer is characterized by other parameters such as the graphene orientation or the graphene type.

In some embodiments, a graphene stack comprises a non-planar graphene layer that has a portion overlaying a side wall of an element, and the element has a height that is between 3 nm and 25 nm, between 25 nm and 1000 nm, between 1 µm and 5 µm, or between 5 µm and 10 µm. In some embodiments, a graphene stack comprises a non-planar graphene layer that has a portion overlaying a side wall or a circumferential surface of a recess, and the recess has a height that is between 0.1 nm and 3 nm, between 3 nm and 25 nm, between 25 nm and 1000 nm, between 1 µm and 5 µm, or between 5 µm and 10 µm.

In some embodiments, a graphene stack comprises a non-planar graphene layer overlaying a circumferential surface of a cone, and the cone has a semi-vertex angle that is between 5 degrees and 10 degrees, between 10 degrees and 20 degrees, between 20 degrees and 30 degrees, between 30 degrees and 50 degrees, or over 50 degrees.

In some embodiments, a graphene stack comprises a non-planar graphene layer that comprises 1 to 50 graphene sheets, 50 to 100 graphene sheets, or 100 to 500 graphene sheets. In some embodiments, the non-planar graphene layer has a characteristic dimension between 1 nm and 20 nm, between 20 nm and 50 nm, between 50 nm and 100 nm, or between 100 nm and 500 nm.

In some embodiments, a graphene stack comprises a plurality of graphene layers with one graphene layer having a characteristic dimension between 1 nm and 20 nm and another graphene layer having a characteristic dimension between 20 nm and 50 nm. In some embodiments, three graphene layers in the same graphene stack have different characteristic dimensions, for instance, a first one between 1 nm and 20 nm, a second one between 20 nm and 50 nm and a third one between 50 nm and 100 nm. In some embodiments, the first graphene layer has a characteristic dimension that is between 25 nm and 35 nm for absorbing or emitting a blue frequency or a blue frequency range, and the second graphene layer has a characteristic dimension that is between 65 nm and 75 nm for absorbing or emitting a green frequency or a green frequency range.

Exemplary methods for fabricating graphite-based devices of the present disclosure are illustrated in FIGS. 12-14. For instance, FIG. 12 provides a flowchart of an exemplary method 1200 that uses dopant profiles to form graphite-based devices of the present disclosure. The method 1200 includes doping the substrate with carbon to produce one or more doped zones in the substrate (e.g., S1210) and then concurrently generating one or more graphene stacks in the one or more doped zones (e.g., S1220). In various embodiments, the doping provides for each doped zone with a plurality of dopant profiles, resulting in each generated graphene stack with a corresponding graphene profile. In some embodiments, the method further includes depositing a barrier layer on the substrate before the doping with carbon, to control or assist the control of the dopant profiles. In many embodiments, a graphene stack comprises a non-planar graphene layer that is characterized by a bending angle, a curvature, a characteristic dimension, a graphene orientation, a graphene type, or any combination of these or other characteristics. More information on the method 1200 can be found, for example, in U.S. Provisional Application No. 61/775,479, the entire contents of which is hereby incorporated by reference herein in its entirety.

In some embodiments, a first zone is doped with a first plurality of dopant profiles, and a first graphene stack is generated in the first zone. In some embodiments, a second zone is doped with a second plurality of dopant profiles, and a second graphene stack is generated in the second zone. In some embodiments, the first and second pluralities of dopant profiles are substantially the same, and consequently, the generated first and second graphene stacks are substantially the same. In some embodiments, the first and second pluralities of dopant profiles are different. As a result, the second graphene stack differs from the first graphene stack in at least one of: (i) a bending angle, (ii) a curvature, (iii) a characteristic dimension, (iv) a graphene orientation or (v) a graphene type. In some embodiments, one or more graphene stacks are generated in a selected zone, and in some cases, the graphene stacks generated in the same zone form physical contacts but functionally separated from each other FIG. 13 provides a flow chart of another exemplary method 1300 that uses graphene foundation materials to form graphite-based devices of the present disclosure. The method 1300 includes creating one or more non-planar graphene foundation layers in one or more selected zones (e.g., S1310) and then concurrently generating one or more graphene stacks by using the one or more non-planar graphene foundation layers in the one or more selected zones (e.g., S1320). In various embodiments, a generated graphene stack comprises a non-planar graphene layer that is characterized by a bending angle, a curvature, a characteristic dimension, a graphene orientation, a graphene type, or any combination of these or other characteristics. In some embodiments, the non-planar graphene foundation layers are formed using oblique angle deposition. In some embodiments, oblique angle deposition is conducted multiple times, each with a different line or deposition angle. In some embodiments, the non-planar graphene foundation layers are formed by conformally depositing a graphene foundation layer in the selected zones followed by anisotropically etching the graphene foundation layer to form a non-planar graphene foundation layer. More information on this method can be found, for example, in U.S. Provisional Application No. 61/759,860, the entire contents of which are hereby incorporated by reference herein in their entireties.

FIG. 14 provides a flow chart of another exemplary method 1400 for forming graphite-based devices of the present disclosure. The method 1400 includes patterning the substrate to form one or more features in one or more selected zones. A patterned feature, such as a first feature formed in a first zone, comprises (i) a non-planar surface, or (ii) at least two adjacent surfaces that are not on a common plane. The method 1400 further includes concurrently generating one or more graphene stacks in the selected zones. A generated graphene stack, such as a first graphene stack formed in the first zone, comprises a non-planar graphene layer that overlays the non-planar surface of the first feature or overlays the two adjacent surfaces of the first feature. Patterning the substrate can be achieved using any standard lithography techniques, some of which are set forth in Sections 7 and 8 below. More information on substrate patterning and graphene generation can be found in, for example, U.S. Provisional Application No. 61/745,464, U.S. Provisional Application No. 61/752,961, U.S. Provisional Application No. 61/762,776, U.S. Provisional Application No. 61/751,774, U.S. Provisional Application No. 61/769,170, the entire contents of each of which are hereby incorporated by reference herein in their entireties.

6. ADVANTAGES

The present disclosure provides a wide variety of graphene or graphite-based devices for various applications. Examples include devices that can interact with resonance or variable wavelength or wavelength ranges, devices that can track solar lights in solar technologies, devices that can redirect or concentrate photons, and antenna arrays that target specific wavelengths or wavelength ranges. Graphite-based devices of the present disclosure in general comprises a non-planar graphene layer that is bent, curved, or in various other configurations.

In some embodiments, graphene or graphite-based devices of the present disclosure are configured to have large workable surface areas that surpass the underlying physical surface areas. The additional workable surface areas absorb or emit photons, resulting in high packing density of the devices and enhanced functionalities of the devices such as efficiency of solar cells or photodetectors.

In some embodiments, graphene or graphite-based devices of the present disclosure are configured to have the ability of performing multiple functions in the same device. For example, in some embodiments, a graphene stack performs one function while another graphene stack performs a different function. In some embodiments, multiple functions are achieved by a single graphene stack, with a graphene layer in the graphene stack performing one function while another graphene layer in the same graphene stack performing a different function.

7. DEPOSITION METHODS

The following subsections describe individual fabrication techniques that can be used to deposit material, e.g. thin film 108, foundation layer 408, hereinafter referred to collectively as "deposit materials," in accordance with embodiments of the present disclosure.

7.1 Chemical Vapor Deposition

In some embodiments, one or more layers of the deposit materials are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

7.2 Reduced Pressure Chemical Vapor Deposition

In some embodiments, one or more layers of the deposit materials are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

7.3 Low Pressure Chemical Vapor Deposition

In some embodiments, one or more layers of the deposit materials are deposited by low pressure chemical vapor deposition (LPCVD) or very low pressure CVD. LPCVD is typically performed at below 1 Pa.

7.4 Atmospheric Chemical Vapor Deposition

In some embodiments, one or more layers of the deposit materials are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

7.5 Plasma Enhanced Chemical Vapor Deposition

In some embodiments, one or more layers of the deposit materials are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

7.6 Anodization

In some embodiments, one or more layers of the deposit materials are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, *J. Electrochem. Soc.* 129, pp. 2749-2752, which is hereby incorporated by reference in its entirety.

7.7 Sol-Gel Deposition Techniques

In some embodiments, one or more layers of the deposit materials are deposited by a sol-gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low-temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

In the semiconductor industry the sol-gel method described is often used to deposit silicon dioxide. The method is known as the Spin-On Glass method (SOG). Spin-On Glass materials have been widely used as a diffusion source or a planarizing dielectric or multilevel metalization schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, Spin-On Glass Materials and Applications in Advanced IC Technologies, 1999, which is hereby incorporated herein by reference in its entirety.

7.8 Plasma Spraying Techniques

In some embodiments, one or more layers of the deposit materials are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet reaches temperatures of 20,000 K and velocities up to 1000 ms-1 in some embodiments. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, Fundamentals of Microfabrication, Second Edition, 2002, pp. 157-159, CRC Press, which is hereby incorporated by reference in its entirety.

7.9 Ink Jet Printing

In some embodiments, one or more layers of the deposit materials are deposited by ink jet printing Ink jet printing is based on the same principles of commercial ink-jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of a deposit material. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink jet head is used for ink jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present disclosure, an epoxy delivery system is used to deposit a layer of a device. An example of an epoxy delivery system is the Ivek Digispense 2000 (Ivek Corporation, North Springfield, Vt.). For more information on jet spraying, see, for example, Madou, Fundamentals of Microfabrication, Second Edition, 2002, pp. 164-167, CRC Press, which is hereby incorporated by reference herein in its entirety.

7.10 Vacuum Evaporation

In one embodiment of the present disclosure, one or more layers of the deposit materials are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, Microchip Fabrication, Fourth Edition, McGraw-Hill, New York, 2000, pp. 407-411, which is hereby incorporated by reference herein in its entirety.

7.11 Sputter Deposition/Physical Vapor Deposition

In another embodiment of the present disclosure, one or more layers of the deposit materials are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, Microchip Fabrication, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as I33 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

7.12 Collimated Sputtering

In another embodiment of the present disclosure, one or more layers of the deposit materials are deposited by collimated sputtering. Collimated sputtering is a sputtering process where the arrival of metal occurs at an angle normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

7.13 Laser Ablated Deposition

In another embodiment of the present disclosure, one or more layers of the deposit materials are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

7.14 Molecular Beam Deposition

In another embodiment of the present disclosure, one or more layers of the deposit materials are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation.

Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

7.15 Ionized Physical Vapor Deposition

In another embodiment of the present disclosure, one or more layers of the deposit materials are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

7.16 Ion Beam Deposition

In another embodiment of the present disclosure, one or more layers of the deposit materials are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately 10-4 Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

7.17 Atomic Layer Deposition

In another embodiment of the present disclosure, one or more layers of the deposit materials are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

7.18 Hot Filament Chemical Vapor Deposition

In another embodiment of the present disclosure, one or more layers of the deposit materials are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

7.19 Screen Printing

In another embodiment of the present disclosure, one or more layers of the deposit materials are deposited by a screen printing (also known as silk-screening) process. A paste or ink is pressed onto portions of an underlying structure through openings in the emulsion on a screen. See, for example, Lambrechts and Sansen, Biosensors: Microelectrochemical Devices, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 μM holes) and a typical paste, a lateral resolution of 100 μM can be obtained.

For difficult-to-print pastes, a shadow mask, such as a thin metal foil with openings, complements the process. However, the resolution of this method is inferior (>500 μM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 μM to 50 μM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, Fundamentals of Microfabrication, Second Edition, CRC Press, Boca Raton, Fla., 2002, pp. 154-156, which is hereby incorporated by reference herein in its entirety.

7.20 Electroless Metal Deposition

In another embodiment of the present disclosure, one or more layers of the deposit materials are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, Fundamentals of Microfabrication, Second Edition, CRC Press, Boca Raton, Fla., 2002, pp. 344-345, which is hereby incorporated by reference herein in its entirety.

7.21 Electroplating

In another embodiment of the present disclosure, one or more layers of the deposit materials are deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

8. LITHOGRAPHIC ETCHING METHODS

The following subsections describe lithographic etching techniques that can be used in the fabrication methods described above. One of skill in the art will appreciate that etching or patterning the substrate can be conducted using other methods including, but not limited to, direct write technologies, Block Copolymer techniques and frequency doubling techniques.

8.1 Cleaning And Dehydration Baking

In some embodiments in accordance with the present disclosure, the fabrication methods begin with a cleaning process. Substrate cleaning is an important step in a lithographic process if there is contamination in presence, as the contamination can severally compromise the adhesion of the resist to the substrate. Substrate surfaces have four general types of contamination: particulates, organic residues, inorganic residues, and unwanted oxide layers. Depending on the substrate and the type of contaminants, several cleaning techniques can be used. These methods include dry cleaning, wet cleanings, ultrasonic agitation, polishing with abrasive compounds, supercritical cleaning.

In some embodiments, a wet cleaning is used to remove organic materials from the substrate and prepare for the adhesion of the resist to the substrate. It is carried out by submerging a substrate in a bath or by rinsing the substrate with DI water and/or a solvent rinse. After the wet cleaning, the substrate is dried to remove moistures. Several drying techniques can be used. For example, in some embodiments, the substrate after wet cleaning can be dried using dehydration bake method. In this method, the substrate is baked at a temperature for a period of time such as baked at 80° C. for several minutes. In some embodiments, the substrate may be dried by $N_2$ flow or spinning. More detailed information with regard to cleaning and drying of a substrate can be found, for example, in Van Zant, Microchip Fabrication, Forth Edition, McGraw-Hill, New York, 2000, pp. 87-131, which is hereby incorporated by reference herein in its entirety.

8.2 Adhesion Promotion Coating

To further improve the adhesion of the resist to the substrate, an adhesion promoter can be applied to the substrate before the application of the resist. Depending on the substrate and the resist, various adhesion promoters can be used. In some embodiments, Bis(trimethylsilyl)amine (also known as hexamethyldisilazane, or HMDS) or other organic materials are chosen as the adhesion promoter for the fabrication processes described in the present application.

HMDS is an organosilicon compound with the molecular formula $[(CH_3)_3Si]_2NH$. The molecule is a derivative of ammonia with trimethylsilyl groups in place of two hydrogen atoms. This colorless liquid is a reagent and a precursor to bases that are popular in organic synthesis and organometallic chemistry. In photolithography, HMDS is often used as an adhesion promoter for photoresist, and can be applied using any suitable conventional methods. For example, HMDS can be applied by vapor chemical deposition. In general, good adhesions are obtained by applying HMDS from the gas phase on heated substrates.

8.3 Bottom Anti-Reflective Coating

Optionally, a bottom anti-reflective coating (BARC) may be applied to help reduce image distortions associated with light reflections during lithography. In some cases, BARCs are critical and highly desirable. For example, when the substrate or a layer on the substrate is highly reflective, as in metal and polysilicon layers, light reflections can destroy the pattern resolution by three mechanisms: a) off-normal incident light can be reflected back through the resist that is intended to be masked; b) incident light can be reflected off device features and expose "notches" in the resist; and c) thin-film interference effects can lead to linewidth variations when resist thickness changes are caused by substrate or wafer topology or nonflatness.

BARCs can be either organic or inorganic, and can be applied either before or after the photoresist. Conventional methods, such as spinning, sputtering or chemical vapor deposition, can be used to apply the BARCs. By reducing standing waves, thin-film interference, or specular reflections, a BARC helps shrink line widths and improves the pattern resolution. In some cases, a BARC can absorb the radiation and dissipates the energy as heat. Such a BARC is generally suitable to be applied to a substrate before the resist. This BARC lowers reflectance back into the photoresist that has passed through the photoresist.

8.4 Resist Properties

One form of photolithographic processing in accordance with the present disclosure begins with the coating of a resist layer over the layer of material to be patterned. Another form of photolithographic processing in accordance with the present disclosure applies the resist coating after at least one of the steps described in the previous sections, i.e., cleaning and dehydration baking, adhesion promotion coating or BARC. Resists used to form this resist layer are typically comprised of organic polymers applied from a solution. In some embodiments, the thickness of the resist is determined using Bossung Curve analysis. Bossung Curve analysis is one of the most commonly used tools in lithography. It maps a control surface for critical dimensions as a function of the variables of focus and exposure (dose). A detailed discussion of the Bossung Curve analysis can be found in Zavecz, Metrology, Inspection and Process Control edited by C. Archie, Proceeding of SPIE (2006) Vol. 6152-109, which is hereby incorporated herein by reference in its entirety.

In some embodiments, this resist layer has a thickness in the range of 0.1 µm to 2.0 µm. Furthermore, in some embodiments, the resist layer has a uniformity of plus or minus 0.01 µm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, Microchip Fabrication, Forth Edition, McGraw-Hill, New York, 2000, pp. 217-222, which is hereby incorporated by reference herein in its entirety.

Negative Resists.

In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethylmethacrylate (PMMA), polymethylisopropyl ketone (PMIPK), poly-butene-1-sulfone (PBS), poly-(trifluoroethyl chloroacrylate) TFECA, copolymer-(V-cyano ethyl acrylate-V-amido ethyl acrylate) (COP), poly-(2-methyl pentene-1-sulfone) (PMPS) and the like.

Positive Resists.

In other embodiments, the resist layer (e.g., positive resist layer of FIG. 2A) is a positive resist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR 1A, LOR 3A, or LOR 5A (MICROCHEM, Newton, Mass.). LOR lift-off resists use polydimethylglutarimide.

8.5 Soft Baking

After the resist layer has been applied, the density is often insufficient to support later processing. And some solvent may inhibit the exposure curve. Accordingly, in some embodiments of the present disclosure, a bake is used to densify the resist layer and drive off residual solvent or excess carrier solvent from the resist layer. After the bake, the resist becomes less tacky and the thickness of the resist layer is reduced slightly. This bake is referred to as a softbake, prebake, or post-apply bake. Several methods of baking the resist layer are contemplated by the present disclosure including, but not limited to, convection ovens, infrared ovens, microwave ovens, or hot plates. See, e.g., Levinson, Principles of Lithography, SPIE Press, Bellingham, Wash., 2001, pp. 68-70, which is hereby incorporated by reference herein in its entirety.

8.6 Alignment and Exposure of the Mask

After the spacer has been coated with a resist layer, the next step is alignment and exposure of the resist layer. Alignment and exposure is, as the name implies, a two-purpose photomasking step. The first part of the alignment and exposure step is the positioning or alignment of the required image on the material surface. The image is found on a mask. The second part is the encoding of the image in the resist layer from an exposing light or radiation source. In the present disclosure, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present disclosure, see, e.g., Solid State Technology, April 1993, p. 26; and Van Zant, Microchip Fabrication, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present disclosure are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments, electron or optical beam writers are used to pattern negative masks or positive masks. See, e.g., Levison, Principles of Lithography, SPIE Press, Bellingham, Wash., 2001, pp. 229-256, which is hereby incorporated by reference herein in its entirety.

Exposing the resist to light breaks or forms chemical bonds in the resist layer. The final image matches the desired pattern from the mask or interference pattern. In various embodiments, attention is focused on providing uniformity of the light intensity and/or controlling the exposure rate.

In one embodiment of the present disclosure, the tool used to project the pattern of a mask onto a device is a wafer stepper. Wafer steppers exist in two configurations, step-and-repeat and step-and-scan. In a step-and-repeat system, the entire area of the mask to be exposed is illuminated when a shutter is opened. In a step-and scan system, only part of the mask, and therefore only part of the exposure field on the device unit, is exposed when a shutter is opened. The entire field is exposed by scanning mask and the device being patterned synchronously. See, e.g., Levison, Principles of Lithography, SPIE Press, Bellingham, Wash., 2001, pp. 133-174, which is hereby incorporated by reference herein in its entirety.

8.7 Post Expose Bake

Before developing the resist, a post exposure bake (PEB) is optionally performed after exposure. In some cases where high resolutions are not required, the PEB is not necessary. However, for certain resists or for high resolutions, a PEB is inevitable for the crosslinking induced by the exposure.

PEB can be applied above the softening point of the resist without destroying the structures to be developed. For example, a PEB can be performed at 110° C., for 1-2 min on a hotplate. A PEB performed near the softening point of the photo resist can reduce mechanical stress formed during softbake and exposure. A PEB can also promote the thermally activated diffusion of carboxylic acid formed during exposure from the photo active compound. This diffusion step smoothes the spatial periodic pattern of carboxylic acid, which in turn will help to improve the image or pattern resolution.

8.8 Development

After exposure through a mask, the pattern is coded as a latent image in resist as regions of exposed and unexposed resist. The pattern is developed in the resist by chemical dissolution of the unpolymerized resist regions. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for many negative-resist-developing situations is xylene or Stoddart solvent. The development step is done with a chemical developer followed by a rinse. For negative resists, the rinse chemical is n-butyl acetate in some embodiments.

Positive resists present a different developing condition. The two regions, polymerized and unpolymerized, have a different dissolving rate. This means that during the developing step some resist is always lost from the polymerized region. Use of developers that are too aggressive or that have overly long developing times result in an unacceptable thinning of the resist. Two types of chemical developers used with positive resists in accordance with the present disclosure are alkaline-water solutions and nonionic solutions. The alkaline-water solutions can be sodium hydroxide or potassium hydroxide. Typical nonionic solutions include, but are not limited to, tetramethylammonium hydroxide (TMAH). The rinse chemical for positive-resist developers is water. A rinse is used for both positive and negative resists. This rinse is used to rapidly dilute the developer chemical to stop the developing action.

There are several methods in which a developer is applied to resist in order to develop the latent image. Such methods include, but are not limited to, immersion, spray development, and puddle development. In some embodiments of the present disclosure, wet development methods are not used. Rather, a dry (or plasma) development is used. In such dry processes, a plasma etcher uses energized ions to chemically dissolve away either exposed or unexposed portions of the resist layer without first developing the resist layer using wet chemical techniques.

In some embodiments, in particular when an organic compound is used as the photoresist, the chemical reaction in the resist layer needs to be controlled to ensure the image fidelity. This can be achieved by controlling the exposure time, the development time, or other processing parameters. Image fidelity herein refers to the ability of a lithographic process to render an image accurately, without any visible distortion or information loss.

8.9 Hard Baking

In some embodiments of the present disclosure, resist is hard baked after it has been developed. The purpose of the hard bake is to achieve good adhesion of the resist layer to the underlying layer to be patterned. In some embodiments, a hard bake is accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Usually the hard baking temperature is the hottest or highest temperature among all of the processes. Nominal hard bake temperatures are from 130° C. to 200° C. for thirty minutes in a convection oven. The hard baking sets the resist and enhances mechanical stability of the resist for the subsequent etch or implant process. At this point, the image fidelity is usually measured and fed back to the preceding lithographic steps.

8.10 Etching

After development, an etching step is used for patterning. A number of etching methods are available. Etching can be divided into dry and wet etching. The following disclosure provides examples of such etching. It will be understood by one of skill in the art that the disclosed etching methods can be used independently of the preceding lithographic steps in accordance with some embodiments. It will be further understood by one of skill in the art that the disclosed etching methods can be used with the preceding lithographic steps in accordance with some embodiments. Wet etching is the use of acidic or basic solutions to solvate away a specific reacted species. Examples are silicon dioxide being etched in hydrofluoric acid, or $Si_3N_4$ in hot phosphoric acid, or mono-crystalline silicon in potassium hydroxide (KOH)). Photoresist materials are removed by acid or base materials (depending on polarity and resist chemistry).

The following list is a generic categorization of the classifications of etches methods. Each etch method has specialized equipment for optimization of the process. Complexity has evolved to the point where some of the terms and techniques are interchangeable. For example, there are terms depending on the vendor, for inductive coupled plasma (ICP) etch or transformer coupled plasma (TCP), each which improves an ion etcher.

8.10.1 Wet Etching

In wet etching, etchant is introduced either as a liquid bath with submersion or a surface spray/mist. Material is removed as a function of solvation of the etch intermediate or byproduct. A limitation of wet etching is the wetting function of the chemical. Some etchants are two step reactions such as oxidation of a material then solvation of the oxide.

Wet etches can also be used in combination with the dry etches as a preparatory step for surface cleaning or contaminate removal. An example is organic material removal prior to a reactive ion etch. Wet etches are isotropic or follow crystal lattices.

In one embodiment of the present disclosure, the structure to be patterned is immersed in a tank of an etchant for a specific time. Then the structure is transferred to a rinse station for acid removal, and transferred to a station for final rinse and a spin dry step.

Wet spray etching or vapor etching. In some embodiments of the present disclosure, wet spray etching or vapor etching is used for patterning. Wet spray etching offers several advantages over immersion etching including the added definition gained from the mechanical pressure of the spray. In vapor etching, the wafer is exposed to etchant vapors such as hydrofluoric acid vapors.

Ion Beam Etching.

Another type of etcher that is used to perform the etching in accordance with various aspects of the present disclosure is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

8.10.2 Dry Etching—Reactive-Ion Etching

Dry etching encompasses other methods outside the wet etch environment. Basic mechanics includes excitation of a chemical to an ionic state and then reaction with the substrate and films. Material is removed either by physical/mechanical methods or chemical conversion and solvation into the gas stream.

Sputter (Physical/Mechanical).

In sputter approaches, ions or elements are accelerated to a high energy and directed toward a surface. Surfaces are removed due to the collisions of these highly charged ions, much like a nanoscale sandblasting method. Sputter etching is facilitated by charging the ion and then establishing a high bias towards to the substrate. Removal is line of sight from the target in the direction of the bias. Sputter etching is a method to achieve anisotropic etch profiles. Sputtering can also be accomplished by directional ion bombardment by 'ion guns'. Examples include focused ion beam (FIB) or other direct write approaches.

Chemical (Solvation—Liquid or Gas).

Chemical enhanced etching exploits generation of intermediate species that can be solvated in the solution or vaporized in the low pressure chamber. Chemical etching is tuned to generate the solvated states due to the chemicals included in the reaction mixture. For example, chlorine is used for most metals. A fluorine based chemical such as carbontetrafluoride ($CF_4$) or sulfurfluoride ($SF_6$) is used for etching silicon or silicon oxide. Oxide etches with $CF_4$ or $SF_6$ follows the same reaction mechanism as the wet etch with HF acid.

Chemical etch is more isotropic in nature than the corresponding sputtering systems. A technique of alternating and combining the two methods can sculpt complex side wall profiles. The present disclose encompasses the use of such methods to generate the specific nodes for functionality. An example is the 'wine glass' structure disclosed FIG. 7 of related application No. 61/802,006, filed Mar. 15, 2013, which is hereby incorporated by reference herein for its disclosure of such structures.

Plasma Etching.

Plasma generation is a method for ionization in the dry etch process. Plasmas can be tuned and controlled for the different gases used. Plasma can be struck with one gas and maintained by another. Relative location of the plasma can increase etch rate or impact resultant damage. Some systems apply remote plasma generation sources while others control the confinement and immersion in the plasma. Generally there is a dilution or carrier gas that maintains the plasma and then a small volume of reactive gas is introduced. Vacuum levels define the type of plasma etching and complexity for control. Power of the generator is a control factor as well as the frequency.

In some embodiments of the present disclosure, plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually $CF_4$ that is mixed with oxygen. A power supply creates a radio frequency (RF) field through electrodes in the chamber. The field energizes the gas mixture to a plasma state. In the energized state, the fluorine attacks the silicon dioxide, converting it into volatile components that are removed from the system by the vacuum system.

Any of a wide variety of plasma etchers is used to perform etching, in accordance with various embodiments of the present disclosure. Such etchers include, but are not limited to, barrel etchers, plasma planar systems, electron cyclotron resonance sources, high density reflected electron sources, helicon wave sources, inductively coupled plasma sources, and transformer coupled plasma sources.

In some embodiments, a reactive ion etcher system combines plasma etching and ion beam etching principles. The systems are similar in construction to the plasma systems but have a capability of ion milling. The combination brings the benefits of chemical plasma etching along with the benefits of directional ion milling. See, e.g., Van Zant, Microchip Fabrication, Fourth Edition, McGraw-Hill, New York, 2000, pp. 256-270, which is hereby incorporated herein by reference for more information on etching techniques and etching equipment that can be used in accordance with the present disclosure.

8.10.3 Characteristics of an Etch Process

The etch process generates an artifact or signature of the processing employed. Knowledge of how to apply etching methods determines the final profile of the structure. Definitions for the following terms are provided in order to convey an understanding of the etch processing characteristics.

Isotropic Etching.

Isotropic implies equal etching in all directions. The two references are vertical and horizontal directions. An isotropic etch 'undercuts' the mask at a ratio to the vertical depth etched. Impact is that a circular opening of 1 micron when etched to a 0.5 micron depth would have a bowl like shape that is 2 microns at the top of the bowl, 1 micron at the bottom, with rounded side walls. An important consideration here is that if a conformal film were deposited over a topography/structure, an isotropic etch would remove the horizontal material as well as the side wall/vertical material. There is no shadowing or off line of sight protection from an isotropic etch (excluding rate limiting or aspect ratio physical diffusivity barriers). This characteristic is used in cleans and sacrificial film removals. One trick is to use isotopic etching to consume the side walls, thereby reducing the critical dimension.

Etching.

Anisotropic etching is preferential etching in one direction over the other. Hence the term anisotropic: not isotropic. Ability to produce anisotropic etch chemistries allows for denser packing of devices. Anisotropy is limited by the bias and directionality of the tool utilized. The mask image is transferred into the substrate with fidelity: a 1 micron circular opening etched to 0.5 micron depth is 1 micron by 0.5 micron feature in the substrate.

An application for the disclosed technology is considering the etching of a conformal coating. If the deposited film is 0.25 microns over a 0.8 micron step, an anisotropic etch removes the 0.25 microns on the surface (horizontal surface) but leaves the side wall (vertical surface) material. Thereby an anisotropic etch results in a new structure of the deposited material where an isotropic etch would remove all material. Limitations on anisotropic etches are physical limitations that inhibit reactive species reaching the bottom surface of the etch location. These topics are defined in 'aspect ratio', 'poisoning', 'etch stops' and other terms below.

8.10.4 Etching Definitions and Examples

Etch rate—A function of the process recipe which quantifies how fast a material is removed. Units are expressed in removed thickness per time, e.g. Angstroms per second. Etch rate includes lateral calculation as well as the vertical component. Etch rate can be reduced by addition of diluents or carrier gases that do no enhance the etch reaction. Etch rate is modified to compensate for reaction chamber design where the etch rate in the center may be higher than on the outer edge. Etch rate is sacrificed for uniformity and repeatability. High etch rates are desirable for manufacturability. However, etch rate is only one part of the grand compromise for a final etch process.

Selectivity—A comparative etch rate ratio of the desired material to be etched and the protective mask material (ratio of material etch rate over mask etch rate). A high selectivity is desired to maintain transfer of the lithography into the substrate. If the selectivity is low the differentiation between starting structure and final structure is compromised due to loss of mask. Etch chemistries are adjusted to achieve the highest selectivity possible without compromising process time for the material etch rate. High selectivity with an Angstrom per hour etch rate is not practical in typical embodiments.

Side wall slope—A desired etch profile could be a perfect transfer of the mask image into the substrate material with vertical sidewalls. The most common etch artifact is an oblique angle slope where the top is wider than the bottom. This can be caused from various etch conditions. A primary mechanism for this is that the etch reaction is hindered by diffusivity of the etchant, by-product interference, loss of ionization states, or competitive nonproductive reactions. In the instant disclosure, both vertical side wall, oblique and re-entry angled structures are contemplated through the disclosed etching techniques.

Re-entrant side wall—The opposite of the oblique angle side wall is the re-entrant side wall angle. Here the bottom is wider than the top masked surface. This profile can be obtained by segmented etching with increasingly isotropic etch recipes. The isotropic undercuts by the lateral etch nature. The resultant structure resembles the dove tail joint in wood working. Another method for reentrant side walls is the enhancement of the etch rate in the trench as a function of dopant materials.

Inhibitor Sidewall protection due to byproduct re-deposition. Another control method for side wall profile is due to the nature of the etchant reaction. The etch reaction may generate a by-product that is not highly volatile. These compounds redeposit on the side wall during the reaction. In an isotropic etch it stops the lateral etch at the top but does not hinder at the bottom area. Re-deposition is viewed as both a positive and negative aspect of the process. Such re-deposition is advantageously used in the present disclosure.

Erosion.

A method to increase the oblique slope of a side wall during an etch process is to erode the masking material at the edges. This is usually a function of heating the mask material during the etch process. This has the impact that the edge acuity of the resist is lost, resulting in the feature size being gradually reduced with etch time. Resist erosion reduces the critical dimension at the top of the feature. Examples of extreme erosion would produce teepee or pyramid like structures.

Etch Stop.

An etch stop material is a material that has a very low etch rate that is built as a sandwich structure in a device. As the target material is etched the structure is defined. However when the etchant hits the etch stop material the maximum depth is reached. This is a method to control the depth of an etch material with high precision. Deposition sandwich can be controlled uniformly across the substrate regardless of the etch reactor design or non uniformity. A second artifact is that the amount of over etch time can be extended and only the lateral etch will continue. Lateral etch results in re-entrant slopes or critical dimension reduction.

Self Limiting or Poisoning.

An etch recipe can be designed in which there is a limitation of the etchant material. Then due to physical constraint such as aspect ratio, dilution, power or bias, the effective etch is restricted. Evidence of this artifact is in deep trench, 10 to 15 microns, where there is tapering and closure. Regardless of the additional time provided the etch depth does not progress. Poisoning of the reaction has the same results but can be observed by additions to the gas stream that inhibits conversion to the desired species, or a competitive reaction that consumes the reactive species in a nonproductive reaction.

Crystalline Specific (Lattice Orientation).

For mono crystalline or highly ordered lattice structures, etchants can be used to highlight and accentuate the lattice structure. For example, iodine based wet etches are used for defect analysis due to different etch rates on the crystal lattice. In some embodiments, crystalline specific etches for special substrate enhancements and for specific devices are used. In some embodiments, metallic etches can improve the surface area for the graphene growth. Moreover, nucleation approaches make use of faceting etch for graphene growth.

8.10.5 Secondary Etch Functions and Utilization

The following provides additional uses for the disclosed etching processes that are used in accordance with some embodiments of the present disclosure.

Cleaning.

Etch removal of contaminates accumulated during previous processing steps can be performed. Examples of a standard etch clean process such as the RCA Clean is 1) application of distilled water, 2) application of buffered ammonium hydroxide, 3) application of dilute HF for ancient oxide, and 4) application of HCl for metallic clean. Clean procedures can also be plasma based prior to a deposition process. A clean process is removing the unwanted films prior to the following step. Cleans can be before etch steps (remove inhibitors), deposition and lithography.

Polish.

A light etch step to change the profile slightly or remove unwanted residuals. For segmented film deposition a slight polish removes undesired side wall material and fine tunes by reduction of material the final film thickness.

Structure Definition.

Previous Discussion Highlighted the Side Wall Slope as nominal/vertical, oblique, or reentrant angled. Functional nodes can be sculpted in the profile by tuning the etch process. A simple example is the wine glass structure which was designed for metal flow into contact views. As the structures became more complex such as for plasmonics, nodes are defined by crevices or protrusion. Full structures such as a rib or ribbon can be generated by an anisotropic etch of a conformally deposited film. These concepts are captured in our portfolio as related to side walls, segmented film deposition, or fine structure lithography to name a few.

Deep Trench and Isolation of Structures.

State of the art technologies have advanced to do deep trench etches with aspect ratios of 20:1 to greater. One of the benefits of trench formation is the ability to isolate structures on the same substrate. The isolation can be by air or a back fill material (dielectric or oxides. The etch process defines the isolation and the resultant critical dimension of the rib or pillar. Polarity is important because the device functionality can be buried in the bottom of the trench and the wall portions can act as thermal radiators, wave guides, or particulate traps.

Aspect Ratios.

Aspect ratio is defined by the height of the structure over the width. In the etch process this impacts the diffusivity of the etchant in a narrow trench (10:1) which will slow the etchant reaction. A secondary concern is the physical stability of a tall feature on a narrow base. Such features are impacted by the microfluidic forces of subsequent processing resulting in toppling or cleavage of the structure.

Side Wall Deposition.

Depending on the application and process engineering this can be a benefit or a detriment. Majority of re-deposition material during an etch process is difficult to remove with later steps (especially metal halides) which is a detriment. The rate of re-deposition can impact the profile of the structure. A benefit of re-deposition is an organic re-deposition or interaction with the photo resist that maintains the resist mask and image fidelity. This re-deposition is a corrective action for undesired resist erosion. Another example of re-deposition being beneficial is when the byproduct material can be formed for a device functionality or structure.

Etch Passivation.

Slight differentiation, or subset of side wall re-deposition. During an etch step and oxidizing ambient may be used as the etchant chemistry. If there are other layers exposed such as metals (aluminum) a thin oxide will be formed which passivates the secondary surface. Other etch byproducts passivates other materials.

8.10.6 Tool Types

The present disclosure encompasses the use of a wide variety of etch tool configurations. Manufactures of such tools include, but are not limited to, Applied materials, Lam Research, Tegal, Hitachi, Oxford, Plasma Therm, and Branson to name a few. Each company has improvements or enhancements over the competitors. The following list highlights some of the designs and types of reactors on the market: barrel etchers, parallel plate, downstream etchers, ICP, TCP, sinks, spray dispense, oxidation, EBEAM oxidation, and direct write systems. For wet etch (wet sinks) there are numbers of designs for recirculation, purity, automation of multiple baths and inclusion of spin rinse dryers. Note also in the literature some tools are refined to the substrate or material designed to be etched: metal etchers, oxide etchers, etc.

8.11 Residual Layer Removal

The result of the etching process described above is the formation of grooves. Next, the residual layer is removed in a process known as resist stripping in order to yield the patterned structure. In some embodiments, the resist is stripped off with a strong acid such as $H_2SO_4$ or an acid oxidant combination, such as $H_2SO_4$—$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present disclosure, a dry plasma process is applied to remove a resist. In such embodiments, the device is placed in a chamber and oxygen is introduced. The plasma field energizes the oxygen to a high energy state, which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern devices is found in Madou, Fundamentals of Microfabrication, Second Edition, CRC Press, Boca Raton, Fla., 2002, pp. 2-65; Van Zant, Microchip Fabrication, Fourth Edition, McGraw-Hill, New York, 2000; Wolf and Tauber, Silicon Processing for the VLSI Era, Second Edition, Lattice Press, Sunset Beach, Calif., 2002; and SZE and Ng, Physics of Semiconductor Devices, Third Edition, Wiley-Interscience, 2007, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three-dimensional lithographic methods.

9. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

What is claimed is:

1. A method for forming a graphite-based device on a substrate, wherein the substrate comprises a plurality of zones, the method comprising:
   doping the substrate with carbon, wherein the doping provides for one or more doped zones, wherein each doped zone in the one or more doped zones comprises a plurality of dopant profiles; and
   concurrently generating one or more graphene stacks in the one or more doped zones, wherein a first graphene stack in the one or more graphene stacks comprises a first non-planar graphene layer that is characterized by a first feature that is (i) a first bending angle, (ii) a first curvature, (iii) a first characteristic dimension, (iv) a first graphene orientation, (v) a first graphene type, or (vi) a first combination thereof.

2. The method of claim 1, wherein a first zone in the plurality of zones is doped with a first plurality of dopant profiles, and the first graphene stack is generated in the first zone.

3. The method of claim 2, wherein a second zone in the plurality of zones is doped with a second plurality of dopant profiles, and a second graphene stack is generated in the second zone, wherein the second graphene stack differs from the first graphene stack generated in the first zone in at least one of (i) a bending angle, (ii) a curvature, (iii) a characteristic dimension, (iv) a graphene orientation, or (v) a graphene type.

4. The method of claim 2, wherein a second zone in the plurality of zones is doped with a second plurality of dopant profiles, and a second graphene stack is generated in the second zone, wherein the second graphene stack is substantially the same as the first graphene stack generated in the first zone.

5. The method of claim 2, wherein
   a second graphene stack is generated in the first zone,
   the second graphene stack differs from the first graphene stack in at least one of (i) a bending angle, (ii) a curvature, (iii) a characteristic dimension, (iv) a graphene orientation, or (v) a graphene type, and
   the second graphene stack is separated from the first graphene stack by a boundary condition.

6. The method of claim 3, wherein
   a third graphene stack is generated in the first zone,
   the third graphene stack differs from the first graphene stack in at least one of (i) a bending angle, (ii) a curvature, (iii) a characteristic dimension, (iv) a graphene orientation, or (v) a graphene type, and the third graphene stack is separated from the first graphene stack by a boundary condition.

7. The method of claim 4, wherein
a third graphene stack is generated in the first zone,
the third graphene stack differs from the first graphene stack in at least one of (i) a bending angle, (ii) a curvature, (iii) a characteristic dimension, (iv) a graphene orientation, or (v) a graphene type, and
the third graphene stack is separated from the first graphene stack by a boundary condition.

8. The method of claim 1, wherein the concurrently generating step comprises concurrently generating from the doping the one or more graphene stacks in the one or more doped zones.

9. The method of claim 1, wherein at least one doped zone in the one or more doped zones comprises at least one dopant profile in the plurality of dopant profiles that is different than another dopant profile in the plurality of dopant profiles.

10. The method of claim 1, wherein the first graphene stack further comprises a second graphene layer that is characterized by a second feature that is (i) a second bending angle, (ii) a second curvature, (iii) a second characteristic dimension, (iv) a second graphene orientation, (v) a second graphene type, or (vi) a second combination thereof, wherein the first feature is different from the second feature.

11. The method of claim 10, wherein the first feature is the first bending angle and the second feature is the second bending angle.

12. The method of claim 10, wherein the first feature is the first curvature and the second feature is the second curvature.

13. The method of claim 10, wherein the first feature is the first characteristic dimension and the second feature is the second characteristic dimension.

14. The method of claim 10, wherein the first feature is the first graphene orientation and the second feature is the second graphene orientation.

15. The method of claim 10, wherein the first feature is the first graphene type and the second feature is the second graphene type.

16. The method of claim 1, wherein the first feature is the first bending angle.

17. The method of claim 1, wherein the first feature is the first curvature.

18. The method of claim 1, wherein the first feature is the first characteristic dimension.

19. The method of claim 1, wherein the first feature is the first graphene orientation.

20. The method of claim 1, wherein the first feature is the first graphene type.

21. The method of claim 1, wherein a first dopant profile in the plurality of dopant profiles is characterized by a first maximum dopant concentration in the substrate and a second dopant profile in the plurality of dopant profiles is characterized by a second maximum dopant concentration in the substrate, wherein the first maximum dopant concentration is other than the second maximum dopant concentration.

22. The method of claim 1, the method further comprising forming a barrier layer over the substrate, prior to the doping step, thereby controlling the plurality of dopant profiles.

* * * * *